(12) United States Patent
Eom et al.

(10) Patent No.: US 11,602,053 B2
(45) Date of Patent: Mar. 7, 2023

(54) DISPLAY DEVICE

(71) Applicant: Samsung Display Co., Ltd., Yongin-Si (KR)

(72) Inventors: Cheol Hwan Eom, Asan-si (KR); Deok Young Choi, Suwon-si (KR)

(73) Assignee: Samsung Display Co., Ltd.

( * ) Notice: Subject to any disclaimer, the term of this patent is extended or adjusted under 35 U.S.C. 154(b) by 30 days.

(21) Appl. No.: 17/238,095

(22) Filed: Apr. 22, 2021

(65) Prior Publication Data

US 2021/0337673 A1    Oct. 28, 2021

(30) Foreign Application Priority Data

Apr. 22, 2020    (KR) .................. 10-2020-0048821

(51) Int. Cl.
| | | |
|---|---|---|
| H05K 1/18 | (2006.01) | |
| G06F 3/041 | (2006.01) | |
| H01L 23/00 | (2006.01) | |
| H01L 27/32 | (2006.01) | |
| H05K 1/11 | (2006.01) | |
| H01L 25/18 | (2023.01) | |

(52) U.S. Cl.
CPC ............ *H05K 1/189* (2013.01); *G06F 3/041* (2013.01); *H01L 24/32* (2013.01); *H01L 27/3276* (2013.01); *H05K 1/118* (2013.01); *G06F 2203/04102* (2013.01); *H01L 25/18* (2013.01); *H01L 27/323* (2013.01); *H01L 2224/32225* (2013.01); *H01L 2227/323* (2013.01); *H05K 2201/10128* (2013.01)

(58) Field of Classification Search
CPC ........ H05K 1/189; H05K 1/118; G06F 3/041; H01L 24/32; H01L 27/3276

USPC ......................................................... 361/749
See application file for complete search history.

(56) References Cited

FOREIGN PATENT DOCUMENTS

| JP | 4968665 B2 | 7/2012 |
|---|---|---|
| JP | 6161293 B2 | 7/2017 |
| JP | 2017-188613 A | 10/2017 |
| KR | 10-0483403 B1 | 8/2005 |
| KR | 10-0601493 B1 | 7/2006 |
| KR | 10-1201658 B1 | 11/2012 |
| KR | 2017-0062209 A | 6/2017 |

OTHER PUBLICATIONS

Communication corresponding to European Patent Application No. 21170019.0 and issued by the European Patent Office dated Sep. 22, 2021, 13 pages.

*Primary Examiner* — Tremesha S Willis
(74) *Attorney, Agent, or Firm* — Innovation Counsel LLP

(57) ABSTRACT

A display device includes the following elements: a base substrate having an active area and a non-active area; a plurality of pads disposed on the non-active area; and a printed circuit disposed on the plurality of pads. The printed circuit may include the following elements: a support layer; a first conductive layer and a second conductive layer respectively disposed on two opposite surfaces of the support layer. The second conductive layer may include the following elements: a first conductive member; a second conductive member; and a space between the first conductive member and the second conductive member. The first conductive member and the second conductive member may be electrically connected to the first conductive layer through contact holes. A side surface of the base substrate may be positioned between two edges of the space in a direction parallel to the support layer.

20 Claims, 26 Drawing Sheets

DISPLAY DEVICE

This application claims priority to Korean Patent Application No. 10-2020-0048821 in the Korean Intellectual Property Office; the Korean Patent Application is incorporated by reference.

BACKGROUND

1. Field

The technical field relates to a display device.

2. Description of the Related Art

Display devices for displaying images are used for various electronic devices, such as smartphones, tablet PCs, digital cameras, notebook computers, navigators, and televisions. A display device typically includes a display panel and a circuit. The display panel may receive signals from the circuit and may display images according to the signals.

SUMMARY

Embodiments may be related a display device capable of preventing driving failure potentially caused by a short between film attachment pads.

According to an embodiment, a display device includes a base substrate in which an active area and a non-active area located around the active area and including a film attachment pad unit are defined; a plurality of film attachment pads disposed on the film attachment pad unit of the base substrate; a flexible printed circuit film disposed on the plurality of film attachment pads; and an anisotropic conductive film disposed between the plurality of film attachment pads and the flexible printed circuit film, wherein the flexible printed circuit film includes: a film support layer; a first film conductive layer disposed on one surface of the film support layer; and a second film conductive layer disposed on the other surface of the film support layer opposite to the one surface of the film support layer, wherein the second film conductive layer includes: a first film conductive pattern; and a second film conductive pattern spaced apart from the first film conductive film with a space therebetween, wherein each of the first film conductive pattern and the second film conductive pattern is connected to the first film conductive layer through a film contact hole, and the space overlaps a side surface of the base substrate.

wherein the flexible printed circuit film further includes: a first solder resist layer disposed on the first film conductive layer; and a second solder resist layer disposed on the second film conductive layer.

wherein the first film conductive layer is disposed between the film support layer and the first solder resist layer, the film support layer is disposed between the first film conductive layer and the second film conductive layer, and the second film conductive layer is disposed between the film support layer and the second solder resist layer.

wherein the second film conductive layer further includes a third film conductive pattern disposed in the space, and the third film conductive pattern is spaced apart from each of the first film conductive pattern and the second film conductive pattern.

wherein the third film conductive pattern is disposed to overlap the side surface of the base substrate in a thickness direction.

wherein the third film conductive pattern is a floating electrode.

The display device further comprises carbide particles disposed on the side surface of the base substrate.

wherein the side surface of the base substrate includes a carbide surface.

wherein the second solder resist layer covers the second film conductive pattern and exposes the space and the first film conductive pattern, and a side surface of the second solder resist layer is located outward from the side surface of the base substrate.

The display device further comprises a cover layer covering the second solder resist layer and the anisotropic conductive film from the outside.

wherein the second solder resist layer is disposed to overlap the side surface of the base substrate in a thickness direction, the display device further includes a panel lower sheet disposed under the base substrate and a panel lower bonding layer disposed between the panel lower sheet and the base substrate, and the panel lower bonding layer includes a conductive material.

The display device further comprises a driving chip mounted on the flexible printed circuit film.

The display device further comprises a driving chip disposed between the film attachment pad unit and the active area on the base substrate in a plan view.

According to another embodiment, a display device includes a base substrate in which an active area and a non-active area located around the active area and including a film attachment pad unit are defined; an interlayer insulating layer disposed on the base substrate; a via layer disposed on the interlayer insulating layer; a touch insulating layer disposed on the via layer; a plurality of film attachment pads disposed on the film attachment pad unit of the base substrate; a flexible printed circuit film disposed on the plurality of film attachment pads; and an anisotropic conductive film disposed between the plurality of film attachment pads and the flexible printed circuit film, wherein the flexible printed circuit film includes: a film support layer; a first film conductive layer disposed on one surface of the film support layer; and a second film conductive layer disposed on the other surface of the film support layer opposite to the one surface of the film support layer, wherein the second film conductive layer includes: a first film conductive pattern; and a second film conductive pattern spaced apart from the first film conductive film with a space therebetween, wherein each of the first film conductive pattern and the second film conductive pattern is connected to the first film conductive layer through a film contact hole, the film attachment pad is disposed on the touch insulating layer, a side surface of the touch insulating layer is disposed between a side surface of the film attachment pad and a side surface of the base substrate, the via layer includes a first via portion overlapping the touch insulating layer in a thickness direction and a second via portion connected to the first via portion and not overlapping the touch insulating layer, a thickness of the second via portion is thinner than a thickness of the first via portion and a part of a side surface of the first via portion is exposed by the second via portion, and the space is disposed to overlap a side surface of the first via portion, the side surface being exposed by the second via portion, in the thickness direction.

The display device further comprises a metal residue disposed on a part of the side surface of the first via portion, the side surface being exposed by the second via portion, wherein the metal residue includes the same material as the film attachment pad.

The display device further comprises a source connection electrode overlapping the film attachment pad in a thickness direction, wherein the source connection electrode is disposed between the base substrate and the touch insulating layer, and is connected to the film attachment pad through a through-hole penetrating the via layer and the touch insulating layer.

The display device further comprises a gate connection electrode overlapping the source connection electrode in the thickness direction, wherein the gate connection electrode is disposed between the base substrate and the touch insulating layer, and is connected to the source connection electrode through a contact hole penetrating the interlayer insulating layer.

wherein the second film conductive layer further includes a third film conductive pattern disposed in the space, and the third film conductive pattern is spaced apart from each of the first film conductive pattern and the second film conductive pattern. the third film conductive pattern is disposed to overlap the side surface of the base substrate in the thickness direction, and the third film conductive pattern is a floating electrode.

wherein the flexible printed circuit film further includes a first solder resist layer disposed on the first film conductive layer and a second solder resist layer disposed on the second film conductive layer, the second solider resist layer covers the second film conductive pattern and exposes the space and the first film conductive pattern, a side surface of the second solder resist layer is located outward from the side surface of the base substrate, and the display device further includes a cover layer covering the second solder resist layer and the anisotropic conductive film from the outside.

wherein the flexible printed circuit film further includes a first solder resist layer disposed on the first film conductive layer and a second solder resist layer disposed on the second film conductive layer, the second solider resist layer is disposed to overlap the side surface of the base substrate in the thickness direction, the display device further includes a panel lower sheet disposed under the base substrate and a panel lower bonding layer disposed between the panel lower sheet and the base substrate, and the panel lower bonding layer includes a conductive material.

An embodiment may be related to display device. The display device may include the following elements: a base substrate comprising an active area and a non-active area neighboring the active area; a plurality of film attachment pads disposed on the non-active area; a flexible printed circuit film disposed on the plurality of film attachment pads; and an anisotropic conductive film disposed between the plurality of film attachment pads and the flexible printed circuit film. The flexible printed circuit film may include the following elements: a film support layer; a first film conductive layer disposed on a first surface of the film support layer; and a second film conductive layer disposed on a second surface of the film support layer opposite the first surface of the film support layer. The second film conductive layer may include the following elements: a first film conductive member; a second film conductive member; and a space positioned between the first film conductive member and the second film conductive member. The first film conductive member and the second film conductive member may be electrically connected to the first film conductive layer through a first contact hole and a second contact hole, respectively. A side surface of the base substrate may be positioned between two edges of the space in a direction parallel to the first surface of the film support layer.

The flexible printed circuit film may include the following elements: a first solder resist layer disposed on the first film conductive layer; and a second solder resist layer disposed on the second film conductive layer.

The first film conductive layer may be disposed between the film support layer and the first solder resist layer. The film support layer may be disposed between the first film conductive layer and the second film conductive layer. The second film conductive layer may be disposed between the film support layer and the second solder resist layer.

The second film conductive layer further may include a third film conductive member disposed in the space. The third film conductive member may be spaced apart from each of the first film conductive member and the second film conductive member.

The side surface of the base substrate may be positioned between two edges of the third film conductive member in the direction parallel to the first surface of the film support layer.

The third film conductive member may be a floating electrode.

The display device may include carbide particles disposed on the side surface of the base substrate.

The side surface of the base substrate may include a carbide surface.

The second solder resist layer may at least partially cover the second film conductive member, may expose each of the space and the first film conductive member, and may be spaced from the side surface of the base substrate in the direction parallel to the first surface of the film support layer.

The display device may include an insulating cover layer directly contacting each of the second solder resist layer and the anisotropic conductive film.

The display device may include the following elements: a panel sheet overlapping the base substrate; and a panel bonding layer disposed between the panel sheet and the base substrate. The side surface of the base substrate may be positioned between two edges of the second solder resist layer in the direction parallel to the first surface of the film support layer. The panel bonding layer may include a conductive material.

The display device may include a driving chip mounted on the flexible printed circuit film.

The display device may include a driving chip. A portion of the non-active area may be disposed between the driving chip and the active area.

An embodiment may be related to a display device. The display device may include the following elements: a base substrate including an active area and a non-active area neighboring the active area; an interlayer insulating layer disposed on the base substrate; a via layer disposed on the interlayer insulating layer; a touch insulating layer disposed on the via layer; a film attachment pad disposed on the non-active area; a flexible printed circuit film disposed on the film attachment pad; and an anisotropic conductive film disposed between the film attachment pad and the flexible printed circuit film. The flexible printed circuit film may include the following elements: a film support layer; a first film conductive layer disposed a first surface of the film support layer; and a second film conductive layer disposed a second surface of the film support layer opposite the first surface of the film support layer. The second film conductive layer may include the following elements: a first film conductive member; a second film conductive member; and a space positioned between the first film conductive member and the second film conductive member. The first film conductive member and the second film conductive member may be electrically connected to the first film conductive layer through a first contact hole and a second contact hole, respectively. The film attachment pad may be disposed on the touch insulating layer. A side surface of the touch insulating layer may be disposed between a side surface of the film attachment pad and a side surface of the base substrate in a direction parallel to the first surface of the film support layer. The via layer may include a first via layer portion overlapping the touch insulating layer in a thickness direction of the via layer and may include a second via layer portion connected to the first via layer portion and not overlapping the touch insulating layer in the thickness direction of the via layer. A maximum thickness of the second via layer portion in the thickness direction of the via layer may be less than a maximum thickness of the first via layer portion in the thickness direction of the via layer. A side surface of the first via layer portion may be positioned between two edges of the space in the direction parallel to the first surface of the film support layer.

The display device may include a metal residue disposed on the side surface of the first via layer portion. A material of the metal residue may be identical to a material of the film attachment pad.

The display device may include a source connection electrode overlapping the film attachment pad in the thickness direction of the via layer. The source connection electrode may be disposed between the base substrate and the touch insulating layer and may be electrically connected to the film attachment pad through a through hole penetrating the via layer and the touch insulating layer.

The display device may include a gate connection electrode overlapping the source connection electrode in the thickness direction of the via layer. The gate connection electrode may be disposed between the base substrate and the touch insulating layer and may be electrically connected to the source connection electrode through a contact hole penetrating the interlayer insulating layer.

The second film conductive layer further may include a third film conductive member disposed in the space. The third film conductive member may be spaced apart from each of the first film conductive member and the second film conductive member. The third film conductive member may overlap the side surface of the base substrate or the side surface of the first via layer portion in the thickness direction of the via layer. The third film conductive member may be a floating electrode.

The flexible printed circuit film may include a first solder resist layer disposed on the first film conductive layer and a second solder resist layer disposed on the second film conductive layer. The second solider resist layer may at least partially cover the second film conductive member, may expose each of the space and the first film conductive member, and may be spaced from the side surface of the base substrate in the direction parallel to the first surface of the film support layer. The display device may include an insulating cover layer directly contacting each of the second solder resist layer and the anisotropic conductive film.

The display device may include the following elements: a panel sheet overlapping the base substrate; and a panel bonding layer disposed between the panel sheet and the base substrate. The flexible printed circuit film further may include a first solder resist layer disposed on the first film conductive layer and a second solder resist layer disposed on the second film conductive layer. The second solider resist layer overlaps the side surface of the base substrate in the thickness direction of the via layer. The panel bonding layer may include a conductive material.

DETAILED DESCRIPTION OF EMBODIMENTS

Figure 1:
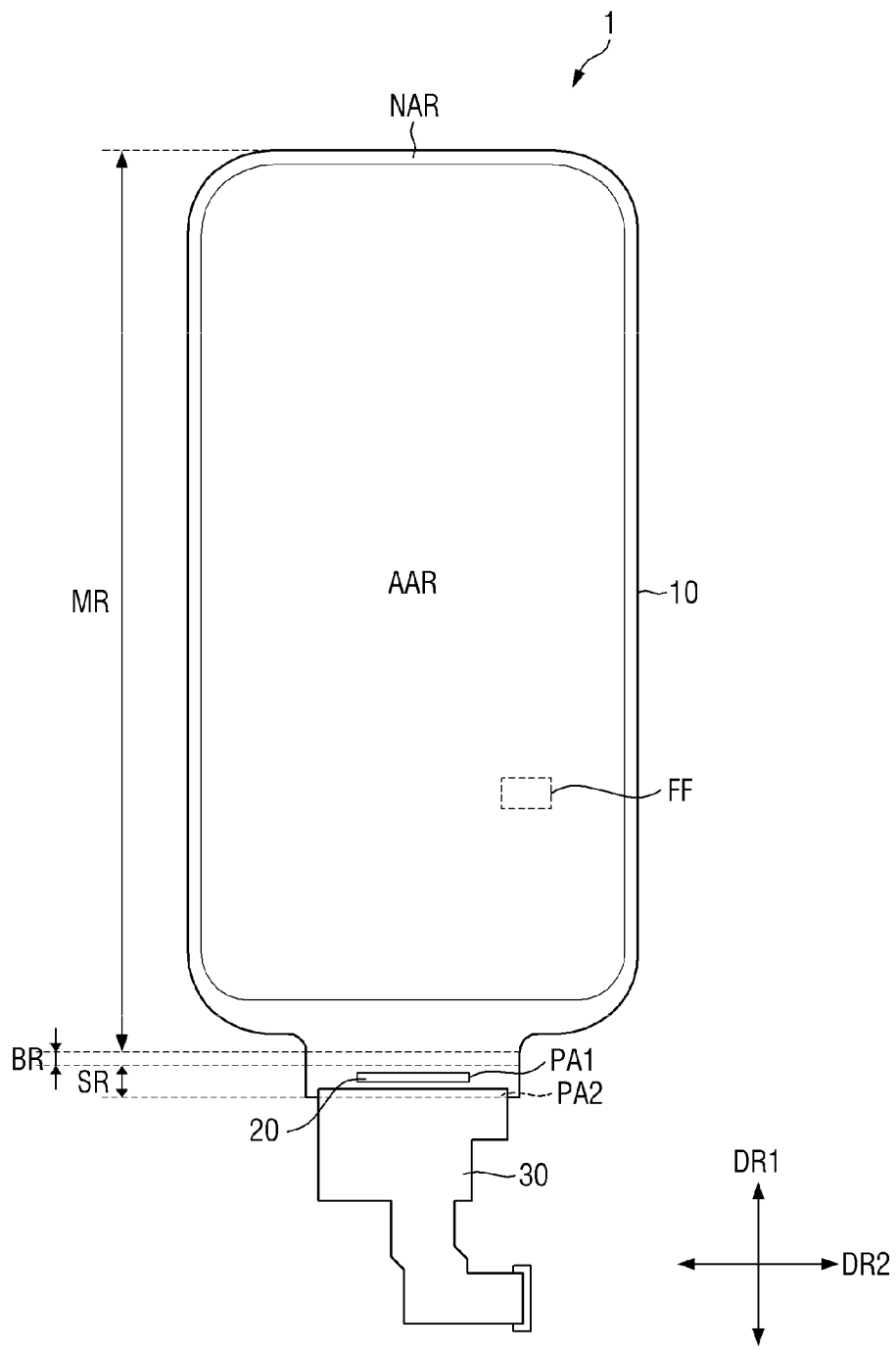
FIG. 1 is a plan view of a display device according to an embodiment.

Example embodiments are described for illustrative purposes. The example embodiments may be embodied in many different forms.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

When a first element is referred to as being connected to a second element, the first element can be directly or indirectly connected to the second element. When a first element is referred to as being directly connected to a second element, there may be no intervening elements connected between the first element and the second element.

The same reference numerals may refer to the same or like parts.

Terms such as "a", "an," "the," and "at least one" may not denote a limitation of quantity and may include both the singular and plural, unless the context clearly indicates otherwise.

"About" or "approximately" may be inclusive of the stated value and may mean within an acceptable range of deviation for the particular value as determined by one of ordinary skill in the art, considering the measurement in question and the error associated with measurement of the particular quantity (i.e., the limitations of the measurement system). For example, "about" or "approximately" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art. Terms, such as those defined in commonly used dictionaries, should be interpreted as having a meaning that is consistent with their meaning in the context of the relevant art and the present disclosure, and should not be interpreted in an idealized or overly formal sense unless expressly so defined herein.

Variations from the shapes of illustrated in the figures as a result, for example, of manufacturing techniques and/or tolerances, are to be expected. Thus, embodiments described herein should not be construed as limited to the particular illustrated shapes but may include deviations in shapes. For example, a region illustrated or described as smooth/flat may have rough and/or nonlinear features. Illustrated sharp angles may be rounded.

The term "connect" may mean "electrically connect" or "electrically connected through no intervening transistor." The term "insulate" may mean "electrically insulate" or "electrically isolate." The term "conductive" may mean "electrically conductive." The term "drive" may mean "operate" or "control." The term "pattern" may mean "member." The expression that a space/hole overlaps an element may mean that an edge of the element is positioned between two opposite edges or two opposite edge sections of the space/hole.

Figure 2:
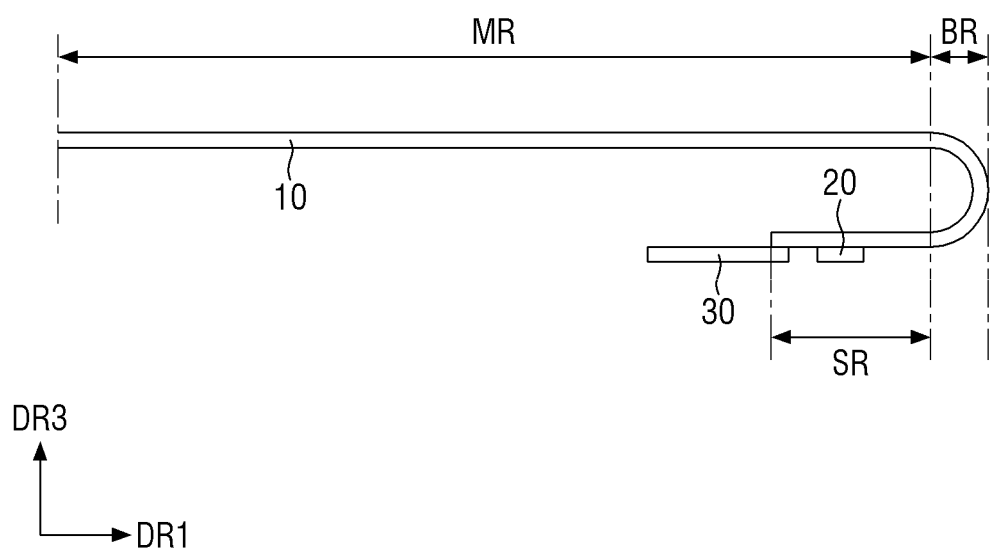
FIG. 2 is a schematic cross-sectional view of a display device according to an embodiment.

FIG. 1 is a plan view of a display device 1 according to an embodiment, and FIG. 2 is a schematic cross-sectional view of the display device 1 according to an embodiment.

A first direction DR1 and a second direction DR2 are different directions. In FIG. 1, for convenience of description, the first direction DR1 is a vertical direction, and the second direction DR2 is a horizontal direction.

The display device 1 may be an electronic device that may display images according input signals. Examples of the display device 1 may include a television, a notebook computer, a monitor, a billboard, an Internet-of-things device, a mobile phone, a smartphone, a tablet personal computer, a smart watch, a watch phone, a mobile communication terminal, an electronic notebook, an electronic book, a portable multimedia player (PMP), a navigator, and an ultra-mobile computer.

The display device 1 includes an active area AAR for displaying images according to input signals and includes a non-active area NAR not for displaying images. Touch sensing functions may be implemented in the active area AAR. A display area and a touch area of the display device 1 may overlap each other in the active area AAR. In the active area AAR, image can be displayed, and touch input can be detected. The shape of the active area AAR may be a rectangle or a rectangle having rounded corners. The length of the active area AAR in the first direction DR1 may be longer than the width of the active area AAR in the second direction DR2. The active area AAR may have one or more of other shapes, such as a square, a circle, and an ellipse.

The non-active area NAR is disposed around the active area AAR. The non-active area NAR may be a bezel area. The non-active area NAR may surround all sides (e.g., four sides) of the active area AAR. The non-active area NAR may not be disposed at the upper side of the active area AAR or at the left and right sides of the active area AAR.

Signal lines or driving circuits for applying signals to the active area AAR (display area or touch area) may be arranged in the non-active area NAR. The non-active area NAR may not include a display area. The non-active area NAR may not include a touch area. The non-active area NAR may include a part of the touch area, and a sensing member such as a pressure sensor may be disposed in the corresponding area. The active area AAR may exactly/substantially correspond to the display area, and the non-active area NAR may exactly/substantially correspond to the non-display area.

The display device 1 includes a display panel 10. Examples of the display panel may include an organic light emitting display panel, a micro LED display panel, a nano-LED display panel, a quantum dot light emitting display panel, a liquid crystal display panel, a plasma display panel, a field emission display panel, an electrophoretic display panel, and an electrowetting display panel. Hereinafter, an organic light emitting display panel is illustrated as an example of the display panel 10.

The display panel 10 may include a plurality of pixels. The plurality of pixels may be arranged in a matrix. The shape of each pixel may be substantially a rectangle or a square in a plan view. Each pixel may have a rhombus shape in which each side is inclined with respect to the first direction DR1. Each pixel may include a light emitting area. Each light emitting area may have the same shape as the pixel or may have a different shape from the pixel. For example, the pixel may have a rectangular shape, and the light emitting area of the corresponding pixel may have one or more shapes such as a rectangle, a rhombus, a hexagon, an octagon, and/or a circle.

The display device 1 may further include a touch member that detects a touch input. The touch member may be provided as a panel or a film separate from the display panel 10 and attached to the display panel 10 or may be provided in the form of a touch layer inside the display panel 10.

The display panel 10 may include a flexible substrate including a flexible polymer material such as polyimide. Accordingly, the display panel 10 may be bent, warped, folded, or rolled.

The display panel 10 may include a bending area BR in which the panel is bent. The display panel 10 may include a main area MR located at one side of the bending area BR and a sub-area SR located at the other side of the bending area BR.

The display area of the display panel 10 is disposed in the main area MR. Edges around the display area, the entire bending area BR, and the entire sub-area SR may be non-display areas. The bending area BR and/or the sub-area SR may include a display area.

The main area MR may generally have a shape similar to the planar appearance of the display device 1. The main area MR may be substantially flat. One or more edges of the main area MR other than the edge (side) connected to the bending area BR may be curved.

The display area or the non-display area may include the curved/bent edge(s), or the display area and the non-display area may be mixed at the curved/bent edge(s).

The bending area BR is connected to one side of the main area MR. For example, the bending area BR may be connected to a short side of the main area MR. The maximum width of the bending area BR may be smaller than the maximum width of the main area MR in the second direction DR2.

In the bending area BR, the display panel 10 may be bent in the thickness direction of the display panel 10 (i.e., the direction DR3 indicated in at least FIG. 5) and in a direction opposite to a display surface. The bending area BR may have a constant radius of curvature or may have different radii of curvature at different sections of the bending area BR.

The sub-area SR extends from the bending area BR. The sub-area SR may extend parallel to the main area MR. The sub-area SR may overlap the main area MR in the thickness direction of the display panel 10. The maximum width (width in the second direction DR2) of the sub-area SR may be equal to the maximum width of the bending area BR in the second direction DR2.

As shown in FIG. 1, the sub-area SR may include a first pad area PA1 and a second pad area PA2 located farther from the bending area BR than the first pad area PAL A driving chip 20 may be disposed in the first pad area PA1 of the sub-area SR. The driving chip 20 may include an integrated circuit for driving the display panel 10. The integrated circuit may include an integrated circuit for display and/or an integrated circuit for a touch unit. The integrated circuit for display and the integrated circuit for the touch unit may be provided as separate chips or integrated into one chip.

The second pad area PA2 of the sub area SR of the display panel 10 may include a plurality of display signal line pads and a plurality of touch signal line pads. A driving substrate 30 may be connected to (and overlap) the second pad area PA2 of the sub-area SR of the display panel 10. The driving substrate 30 may be a flexible printed circuit board or a film.

Figure 3:
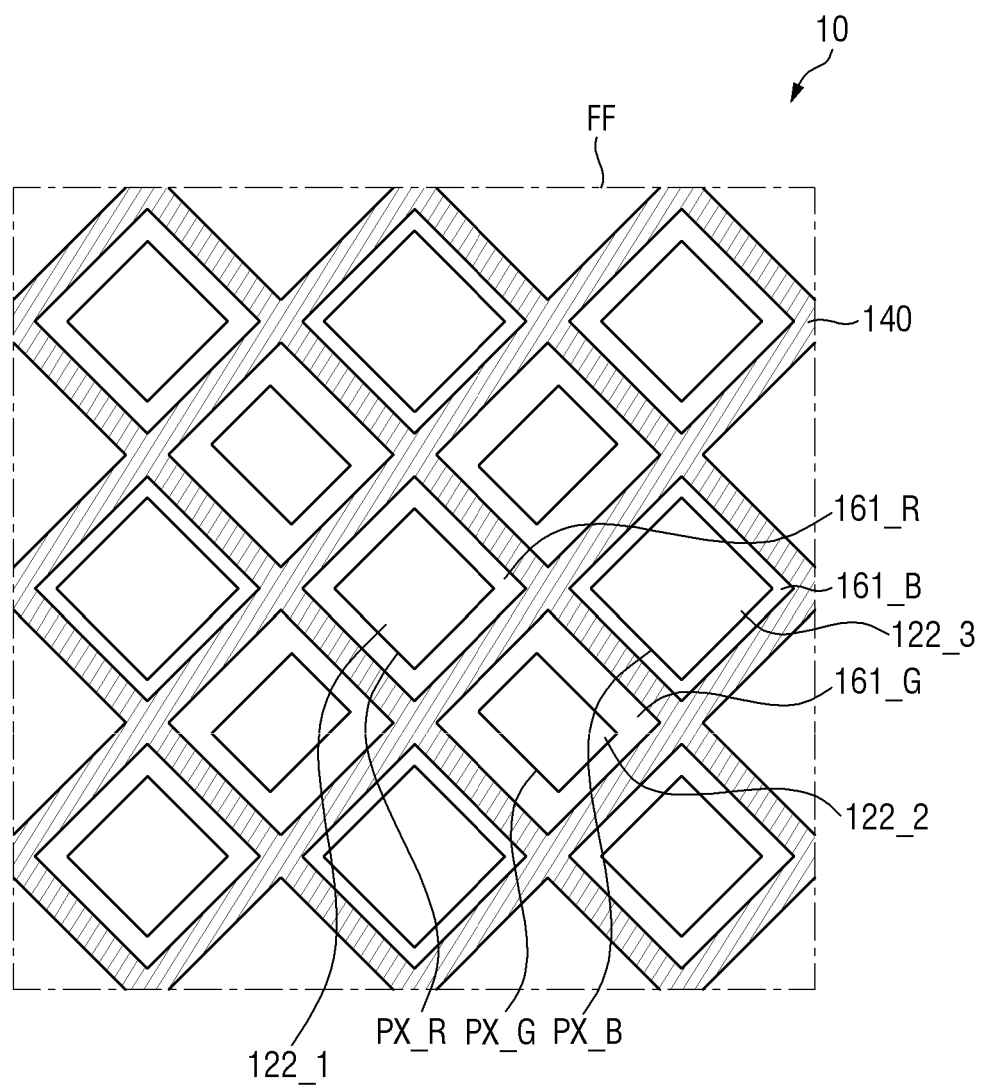
FIG. 3 is a schematic layout view showing the portion FF of FIG. 1 according to an embodiment.

FIG. 3 is a schematic layout view showing the portion FF of FIG. 1 according to an embodiment.

Referring to FIG. 3, the display panel 10 includes a plurality of pixels PX_R, PX_G, and PX_B. The plurality of pixels PX_R, PX_G, and PX_B may be a plurality of color pixels. For example, the plurality of pixels may include a red pixel PX_R, a green pixel PX_G, and a blue pixel PX_B. The plurality of pixels may further include a white pixel. In an embodiment, cyan, magenta, and yellow pixels may be disposed instead of red, green, and blue pixels.

The red, green, and blue pixels PX_R, PX_G, and PX_B may be alternately arranged. Each of the pixels PX_R, PX_G, PX_B may have a rectangular shape. The pixels PX_R, PX_G, PX_B may have different sizes. For example, each blue pixel PX_B may be larger than each red pixel PX_R, and each red pixel PX_R may be larger than each green pixel PX_G.

A red pixel PX_R may include a red organic light emitting layer 122_1 and a red first color filter 161_R. A green pixel PX_G may include a green organic light emitting layer 122_2 and a green second color filter 161_G. A blue pixel PX_B may include a blue organic light emitting layer 122_3 and a blue third color filter 161_B. In an embodiment, each of the red, green, and blue pixels PX_R, PX_G, and PX_B may include a white organic light emitting layer and a color filter of the corresponding color. The white organic light emitting layer may be formed by stacking two or more organic light emitting layers.

The red first color filter 161_R selectively transmits red light. The wavelength of the red light may be in a range of about 620 nm to about 750 nm. The green color filter selectively transmits green light. The wavelength of the green light may be in a range of about 495 nm to about 570 nm. The blue color filter selectively transmits blue light. The wavelength of blue light may be in a range of about 450 nm to about 495 nm.

The first color filter 161_R may be disposed in the red pixel PX_R, the second color filter 161_G may be disposed in the green pixel PX_G, and the third color filter 161_B may be disposed in the blue pixel PX_B. The color filters 161_R, 161_G, and 161_B may be respectively disposed on the corresponding organic light emitting layers 122_1, 122_2, and 122_3, thereby preventing color mixing in the corresponding pixel and increasing color reproducibility. Since the color filters 161_R, 161_G, and 161_B absorb external light to a considerable level, it is possible to reduce the reflection of external light without additionally providing a polarizing plate.

The shapes of the first color filter 161_R, the second color filter 161_G, and/or the third color filter 161_B may be substantially the same as the shapes of the pixels. When the shape of a pixel is a rhombus, the shape of a color filter may also be a rhombus.

A black matrix 140 (or black member 140) may be disposed at the boundaries of the pixels. The black matrix 140 may have a lattice structure and may partition the pixels PX_R, PX_G, and PX_B.

Figure 4:
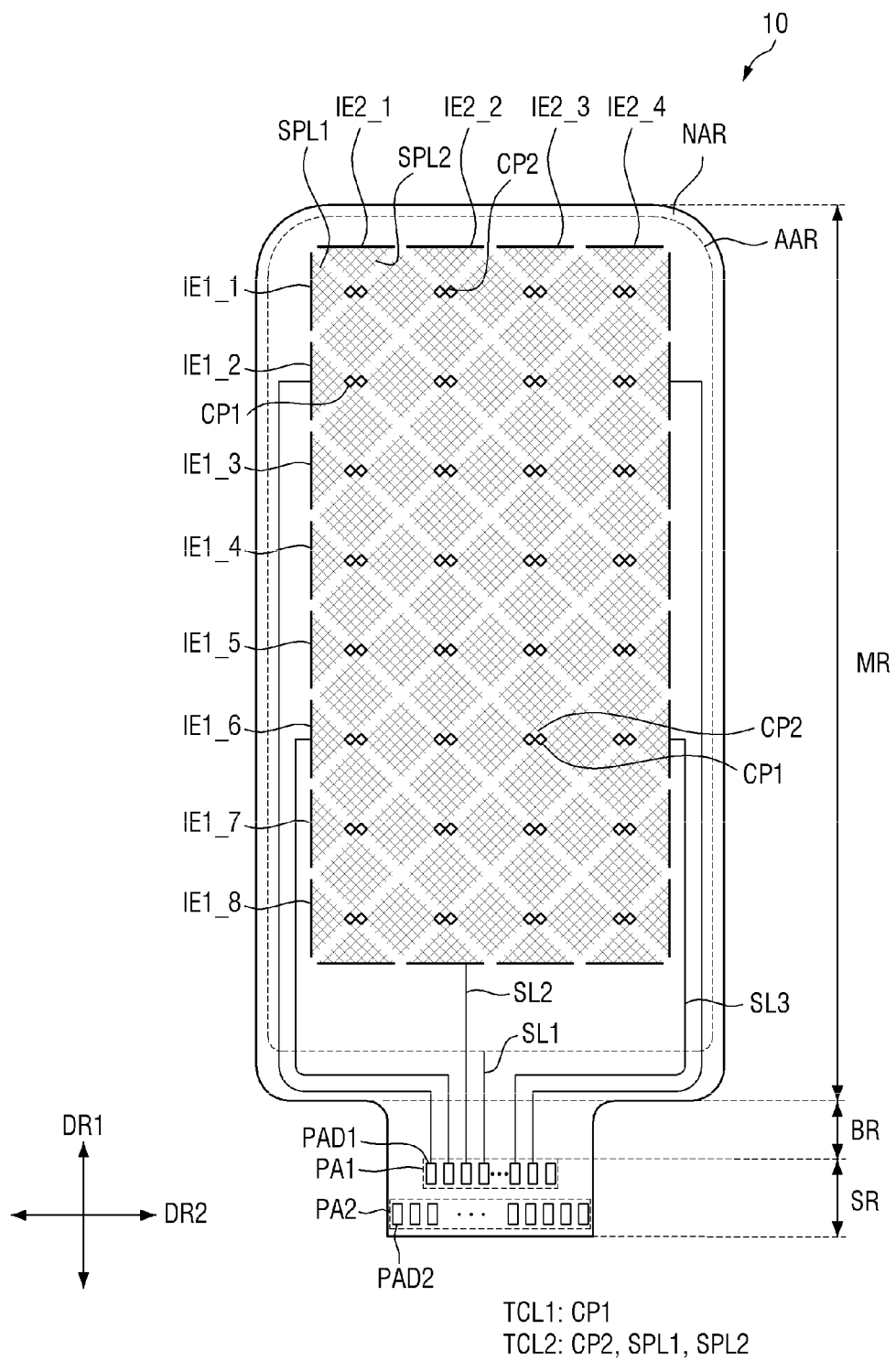
FIG. 4 is a plan view of a display panel including a touch sensing member according to an embodiment.
Figure 5:
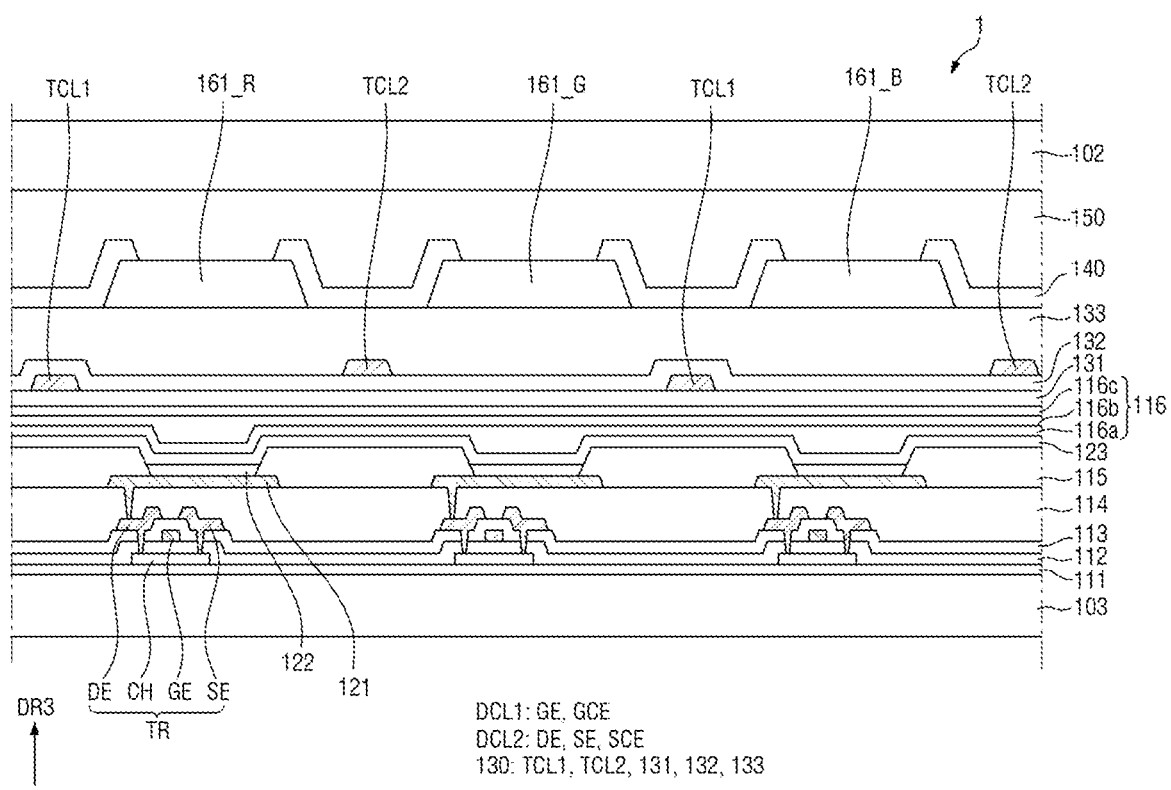
FIG. 5 is a cross-sectional view of a main area of a display panel according to an embodiment.
Figure 6:
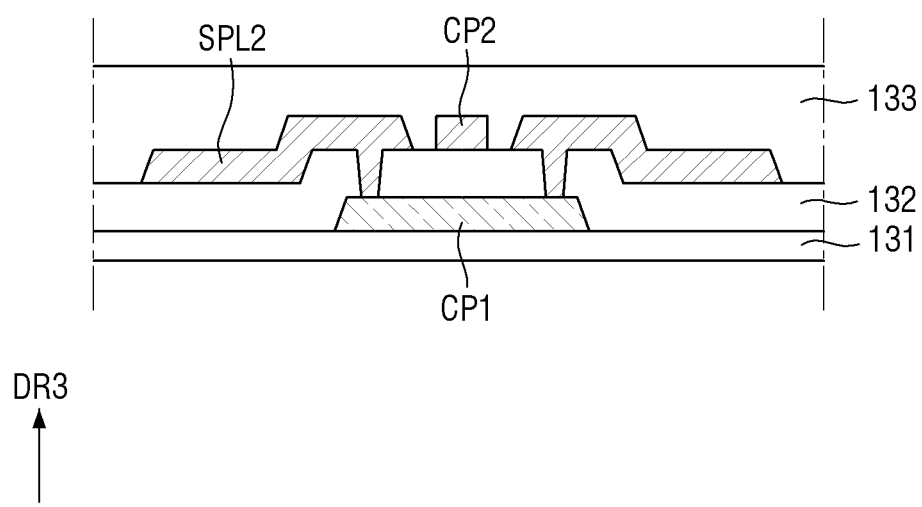
FIG. 6 is a schematic cross-sectional view of a touch sensing member according to an embodiment.

FIG. 4 is a plan view of a display panel 10 including a touch sensing member according to an embodiment, FIG. 5 is a cross-sectional view of a main area of the display panel 10 according to an embodiment, and FIG. 6 is a schematic cross-sectional view of the touch sensing member according to an embodiment.

Referring to FIGS. 4 to 6, the display device 1 (or display panel 10) may include a base substrate 103, a plurality of conductive layers disposed on the base substrate 103, an insulating layer, a light emitting element, an encapsulation layer, a touch sensing member, and a plurality of color filters, and a black matrix.

The base substrate 103 may be a flexible substrate. For example, the base substrate 103 may be a film and/or plastic substrate including a polymer organic material. For example, the base substrate 103 may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. The base substrate 103 may include fiber glass reinforced plastic (FRP).

A buffer layer 111 may be disposed on the base substrate 103. The buffer layer 111 may provide a smooth surface on the base substrate 103 and prevent penetration of moisture or external air. The buffer layer 111 may be an inorganic layer. The buffer layer 111 may be a single-layer film or a multi-layer film.

A plurality of thin film transistors TR may be disposed on the buffer layer 111. The plurality of thin film transistors TR may be driving thin film transistors. One or more thin film transistors TR may be provided for each pixel. A thin film transistor TR may include a semiconductor layer CH, a gate electrode GE, a source electrode SE, and a drain electrode DE.

The semiconductor layer CH may be disposed on the buffer layer 111. The semiconductor layer CH may include at least one of amorphous silicon, poly silicon, and an organic semiconductor. The semiconductor layer CH may include an oxide semiconductor.

The semiconductor layer CH may include a channel region and may include a source region and a drain region which are disposed on two sides of the channel region and are doped with impurities.

A gate insulating layer 112 may be disposed on the semiconductor layer CH. The gate insulating layer 112 may be an inorganic layer. The gate insulating layer 112 may be a single-layer film or a multi-layer film.

A first conductive layer DCL1 may be disposed on the gate insulating layer 112. The first conductive layer DCL1 may include a gate electrode GE and a gate connection electrode GCE (illustrated in at least FIG. 9). The gate electrode GE may be disposed in the active area AAR, and the gate connection electrode GCE may be disposed in the non-active area NAR and/or the sub-area SR.

The first conductive layer DCL1 may be formed of a metal material having conductivity. For example, the first conductive layer DCL1 may include molybdenum (Mo), aluminum (Al), copper (Cu), and/or titanium (Ti). The first conductive layer DCL1 may be a single-layer film or a multi-layer film.

An interlayer insulating layer 113 may be disposed on the first conductive layer DCL1. The interlayer insulating layer 113 may be an inorganic layer. The interlayer insulating layer 113 may be a single-layer film or a multi-layer film.

A second conductive layer DCL2 may be disposed on the interlayer insulating layer 113. The second conductive layer DCL2 may include a source electrode SE, a drain electrode DE, and a source connection electrode SCE (illustrated in at least FIG. 9). The second conductive layer DCL2 may include a high-potential voltage wire, a low-potential voltage wire, and a plurality of data lines.

The source electrode SE and the drain electrode DE may be electrically (and directly) connected to the source region and drain region of the semiconductor layer CH, respectively, through contact holes penetrating the interlayer insulating layer 113 and the gate insulating layer 112.

The electrodes SE and DE may be disposed in the active area AAR, and the source connection electrode SCE may be disposed in the non-active area AAR and the sub-area SR.

The second conductive layer DCL2 is formed of a metal material having conductivity. For example, the second conductive layer DCL2 may include aluminum (Al), copper (Cu), titanium (Ti), and/or molybdenum (Mo). The display device 1 may further include a storage capacitor and a switch thin film transistor on the base substrate 103.

A via layer 114 may be disposed on the second conductive layer DCL2 and the interlayer insulating layer 113. The via layer 114 may be a planarization film. The via layer 114 may include acrylate or polyimide.

The via layer 114 may be a passivation film. The passivation film may include $SiO_2$ and/or $SiNx$.

A plurality of first electrodes 121 may be disposed on the via layer 114. Each first electrode 121 may be a pixel electrode disposed for a pixel. The first electrode 121 may be an anode electrode of an organic light emitting diode. The first electrode 121 may be electrically connected to the drain electrode DE (or source electrode SE) disposed on the first substrate 101 through a via hole passing through the via layer 114.

The first electrode 121 may include a material having a high work function. The first electrode 121 may include indium tin oxide (ITO), indium zinc oxide (IZO), zinc oxide (ZnO), and/or indium oxide ($In_2O_3$), which may have relatively high work functions and transparent properties. When the organic light emitting display device is a front emission type, the first electrode 121 may further include a reflective material, for example, silver (Ag), magnesium (Mg), aluminum (Al), platinum (Pt), lead (Pd), gold (Au), nickel (Ni), neodymium (Nd), iridium (Jr), chromium (Cr), lithium (Li), calcium (Ca), or a mixture/alloy of some of the metal materials, in addition to at least one of the above-mentioned transparent conductive materials. The first electrode 121 may have a single layer structure or may a multi-layer structure.

A pixel defining layer 115 may be disposed on the first electrode 121. The pixel defining layer 115 includes an opening that exposes at least a part of the first electrode 121. The pixel defining layer 115 may include an organic material or an inorganic material. The pixel defining layer 115 may include a photoresist, a polyimide resin, an acrylic resin, a silicon compound, and/or a polyacrylic resin.

An organic light emitting layer 122 may be disposed on the part of the first electrode 121 exposed by the pixel defining layer 115. A second electrode 123 may be disposed on the organic light emitting layer 122. The second electrode 123 may be a common electrode disposed over multiple pixels.

The second electrode 123 may include a material having a low work function. The second electrode 123 may include Li, Ca, LiF—Ca, LiF—Al, Al, Mg, Ag, Pt, Pd, Ni, Au Nd, Jr, Cr, BaF, Ba, a compound of some of the above materials, or a mixture of some of the above materials (for example, a mixture of Ag and Mg). The second electrode 123 may further include an auxiliary electrode. The auxiliary electrode may include a film formed by deposition of at least one of the above materials, and a transparent metal oxide such indium tin oxide (ITO), indium zinc oxide (IZO), zinc oxide (ZnO), indium tin zinc oxide (ITZO) on the film.

When the display device 1 is of a front emission type a conductive layer having a small work function is formed into a thin film, and one or more transparent conductive layers such as one or more of an indium tin oxide (ITO) layer, an indium zinc oxide (IZO) layer, a zinc oxide (IZO) layer, and an indium oxide ($In_2O_3$) layer may be stacked on the thin film.

The first electrode 121, the organic light emitting layer 122, and the second electrode 123, described above, may constitute an organic light emitting diode.

A hole injection layer and/or a hole transporting layer may be disposed between the first electrode 121 and the organic light emitting layer 122, and an electron transporting layer and/or an electron injection layer may be disposed between the organic light emitting layer 122 and the second electrode 123.

An encapsulation layer 116 may be disposed on the second electrode 123. The encapsulation layer 116 includes at least one inorganic layer and at least one organic layer. The at least one inorganic layer and the at least one organic layer may be stacked with each other. For example, as shown in FIG. 6, the encapsulation layer 116 may be a multi-layer film including a first encapsulation inorganic layer 116a, an encapsulation organic layer 116b, and a second encapsulation inorganic layer 116c, which are sequentially stacked. Each of the first encapsulation inorganic layer 116a and the second encapsulation inorganic layer 116c may include at least one of silicon oxide (SiOx), silicon nitride (SiNx), and silicon oxynitride (SiONx); the encapsulation organic layer 116b may include at least one of epoxy, acrylate, and urethane acrylate.

The touch sensing member may be disposed on the encapsulation layer 116.

The touch sensing member may include a first touch insulating layer 131 disposed on the encapsulation layer 116, a first touch conductive layer TCL1 disposed on the first touch insulating layer 131, a second touch insulating layer 132 disposed on the first touch conductive layer TCL1, a second touch conductive layer TCL2 disposed on the second touch insulating layer 132, and a third touch insulating layer 133 disposed on the second touch conductive layer TCL2.

The first touch conductive layer TCL1 may include first touch bridge electrodes CP1 electrically connecting adjacent members of each of the first sensing electrodes IE1_1, IE1_2, IE1_3, IE1_4, IE1_5, IE1_6, IE1_7, and IE1_8. The second touch conductive layer TCL2 may include the first sensing electrodes IE1_1 to IE1_8, may include second sensing electrodes IE2_1, IE2_2, IE2_3, and IE2_4, and may include second touch bridge electrodes CP2 electrically connecting adjacent members of each of the second sensing electrodes IE2_1 to IE2_4. The first touch conductive layer TCL1 may be directly disposed on the encapsulation layer 116.

The first sensing electrodes IE1_1 to IE1_8 may each extend (i.e., be lengthwise) in the second direction DR2 and may be arranged along the first direction DR1. The second sensing electrodes IE2_1 to IE2_4 may each extend (i.e., be lengthwise) in the first direction DR1 and may be arranged along the second direction DR2.

Each of the first sensing electrodes IE1_1 to IE1_8 may include a plurality of first sensing lines SPL1 forming mesh structures. The areas divided by the first sensing lines SPL1 may overlap organic light emitting layers 122_1, 122_2, and 122_3 (described with reference to FIG. 2).

Each of the second sensing electrodes IE2_1 to IE2_4 may include a plurality of second sensing lines SPL2 forming mesh structures. The areas divided by the plurality of second sensing lines SPL2 may overlap organic light emitting layers 122_1, 122_2, and 122_3. Each area divided by first sensing lines SPL1 and each area divided by second sensing lines SPL2 may have a substantially rhombus shape.

The first sensing lines SPL1 are electrically insulated from the second sensing lines SPL2. The plurality of first sensing lines SPL1 may be disposed directly on the same insulating layer as the plurality of second sensing lines SPL2. In this case, the plurality of first touch bridge electrodes CP1 and the plurality of second touch bridge electrodes CP2 are arranged directly on different insulating layers and are electrically insulated from each other.

In some embodiments, the electrodes included in the first touch conductive layer TCL1 may be opposite the electrodes included in the second touch conductive layer TCL2.

In some embodiments, the first touch conductive layer TCL1 may include the first sensing electrodes IE1_1 to IE1_8 and the first touch bridge electrode CP1, and the second touch conductive layer TCL2 may include the second sensing electrodes IE2_1 to IE2_4 and the second touch bridge electrode CP2.

The second touch conductive layer TCL2 may further include a driving chip attachment pad PAD1 and a film attachment pad PAD2. A plurality of driving chip attachment pads PAD1 and a plurality of film attachment pads PAD2 may be provided. The driving chip attachment pads PAD1 may be arranged along the second direction DR2. The plurality of film attachment pads PAD2 may be arranged along the second direction DR2.

The plurality of pads with driving chips PAD1 may be disposed in the first pad area PA1, and the plurality of film attachment pads PAD2 may be disposed in the second pad area PA2. The driving chip 20 (described with reference to FIG. 1) may be disposed in the first pad area PA1, and the flexible printed circuit film 50 (described with reference to FIG. 1) may be disposed in the second pad area PA2.

The first pad area PA1 may be disposed between the second pad area PA2 and the active area AAR. The driving chip 20 may be disposed between the flexible printed circuit film 50 and the active area AAR.

The plurality of first sensing lines SPL1 and the plurality of second sensing lines SPL2 may include a conductive material. The conductive material may include a low-resistance metal such as silver (Ag), aluminum (Al), chromium (Cr), and/or nickel (Ni), and/or may include a conductive nanomaterial such as silver nanowires and/or carbon nanotubes.

Referring to FIG. 4, the display device 1 may include a first signal line SL1 (extending from the active area AAR), a second signal line SL2, and a third signal line SL3. The second signal line SL2 may be electrically connected to the second sensing electrodes IE2_1 to IE2_4 of the touch sensing member. The third signal line SL3 may be electrically connected to the first sensing electrodes IE1_1 to IE1_8 of the touch sensing member. Each of the signal lines SL1 to SL3 may extend to the first pad area PA1 to be connected to the driving chip attachment pad PAD1. Some of the plurality of film attachment pads PAD2 may be connected to the driving chip attachment pads PAD1. Others of the plurality of film attachment pads PAD2 may not be electrically connected to the driving chip attachment pads PAD1.

Each of the first touch insulating layer 131 and the second touch insulating layer 132 may include an inorganic material. The inorganic material may include at least one of silicon oxide (SiOx), silicon nitride (SiNx), and silicon oxynitride (SiONx).

The second touch conductive layer TCL2 may be disposed on the first touch insulating layer 131. The above-described touch electrode and touch bridge electrode of the second touch conductive layer TCL2 may overlap the black matrix 140 and the pixel defining layer 115 and may be invisible or inconspicuous to a user.

The third touch insulating layer 133 may include an organic material. The organic material may include acrylic resin, methacrylic resin, polyisoprene, vinyl resin, epoxy resin, urethane resin, cellulose resin, siloxane resin, polyimide resin, polyamide resin, or perylene resin.

Referring to FIG. 4 and FIG. 5, the color filters 161_R, 161_G, and 161_B may be disposed on the touch sensing member.

The black matrix 140 may be disposed between the color filters 161_R, 161_G, and 161_B. The black matrix 140 may overlap the above-described touch electrode and touch bridge electrode of the second touch conductive layer TCL2.

The black matrix 140 may include a light absorbing material or a light reflecting material. For example, the black matrix 140 may include a black colored resin or a reflective metal such as chromium (Cr).

A window 102 may be disposed on the black matrix 140. The window 102 includes a flexible material, and may cover all the underlying components. The window 102 and the display panel 10 may be coupled to each other through an inter-module adhesive layer 150.

Figure 7:
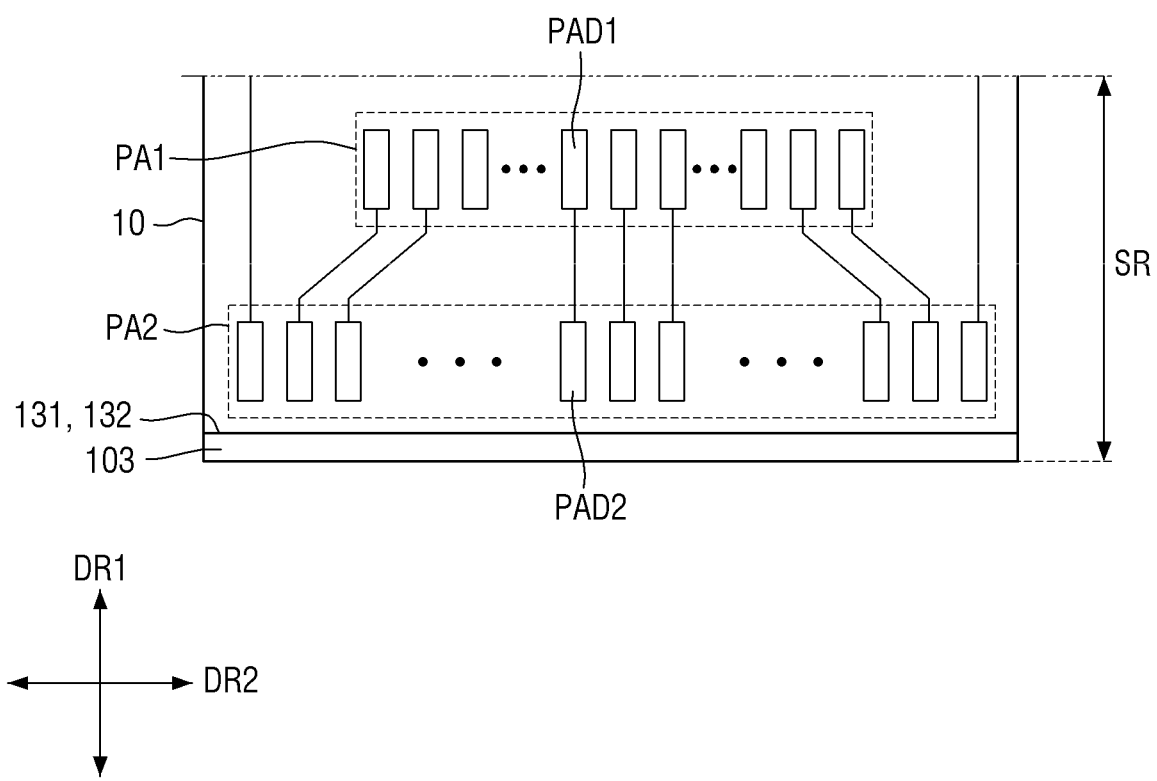
FIG. 7 is a plan view of a sub-area of a display panel according to an embodiment.
Figure 8:
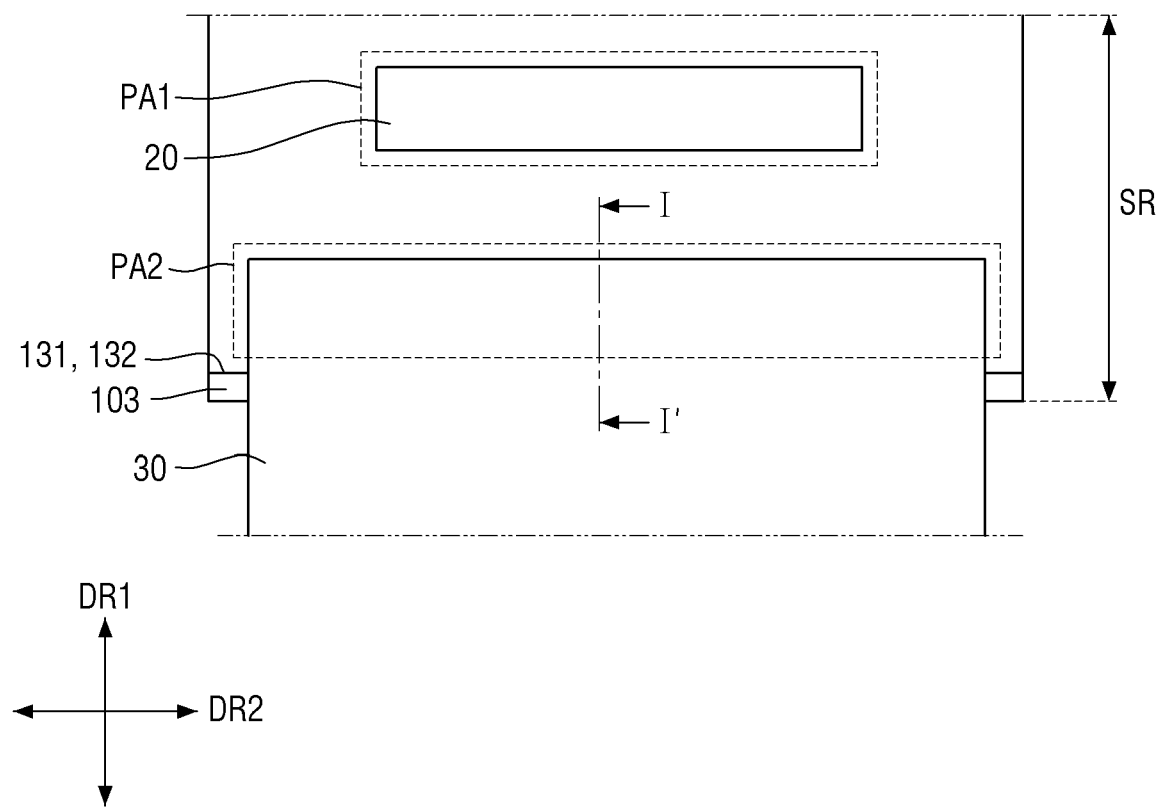
FIG. 8 is a plan view showing a base substrate, a first touch insulating layer, a second touch insulating layer, a driving chip, and a flexible printed circuit film of a sub-area according to an embodiment.

FIG. 7 is a plan view of a sub-area of a display panel according to an embodiment. FIG. 8 is a plan view showing a base substrate, a first touch insulating layer, a second touch insulating layer, a driving chip, and a flexible printed circuit film of the sub-area according to an embodiment.

Referring to FIGS. 7 and 8, an end/edge of the touch insulating layer 131 or 132 may be located between the second pad area PA2 and an end/edge of the base substrate 103. The end/edge of the touch insulating layer 131 or 132 may be located between a film attachment pad PAD2 and the end/edge of the base substrate 103.

The flexible printed circuit film 30 may be attached onto the plurality of film attachment pads PAD2, and the driving chip 20 may be attached onto the plurality of driving chip attachment pads PAD1.

Figure 9:
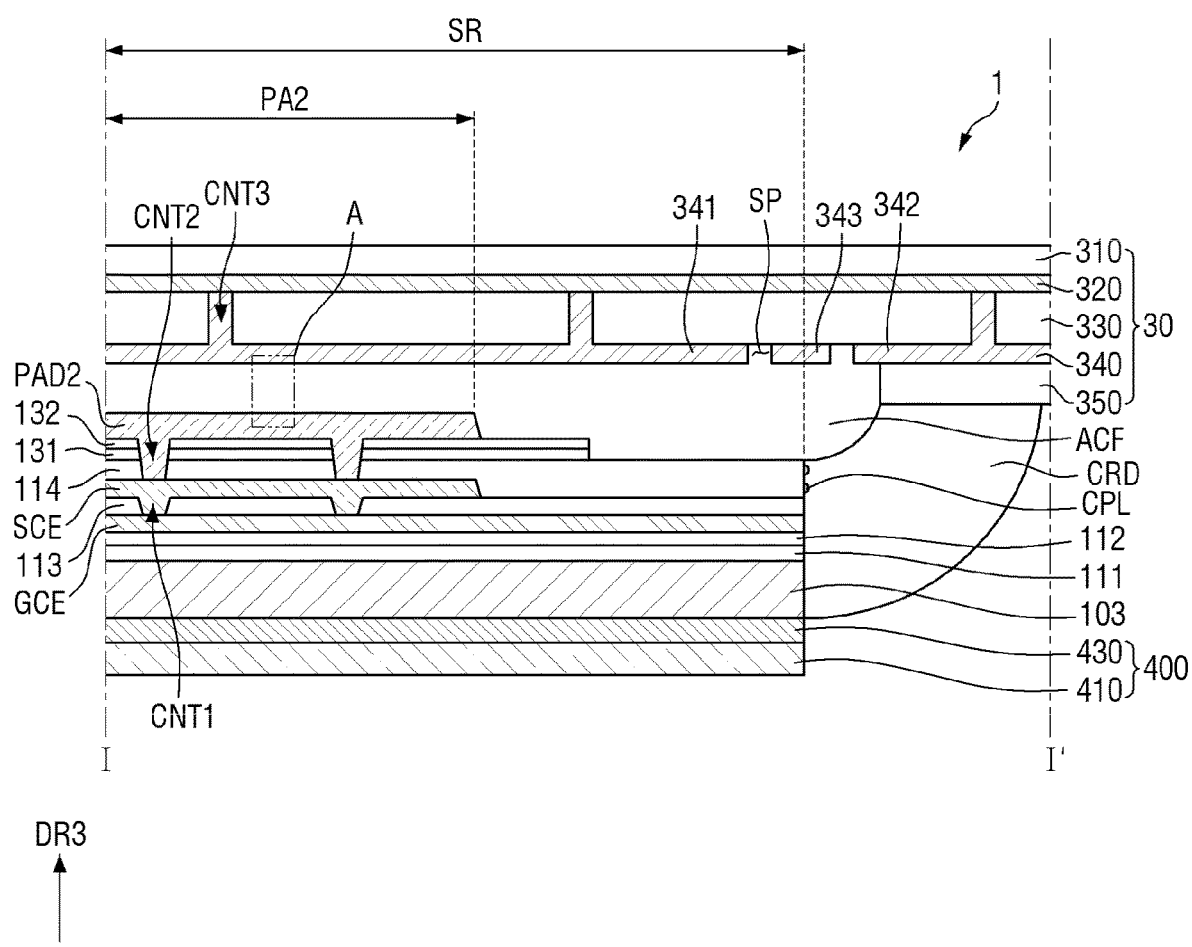
FIG. 9 a cross-sectional view taken along the line I-I' of FIG. 8 according to an embodiment.
Figure 10:
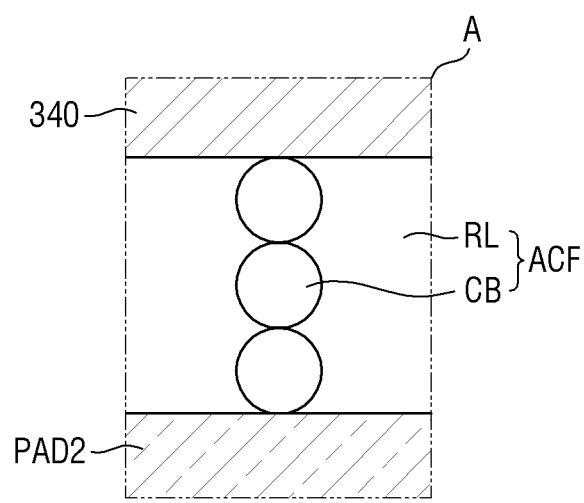
FIG. 10 is a cross-sectional view of the area A in FIG. 9 according to an embodiment.
Figure 11:
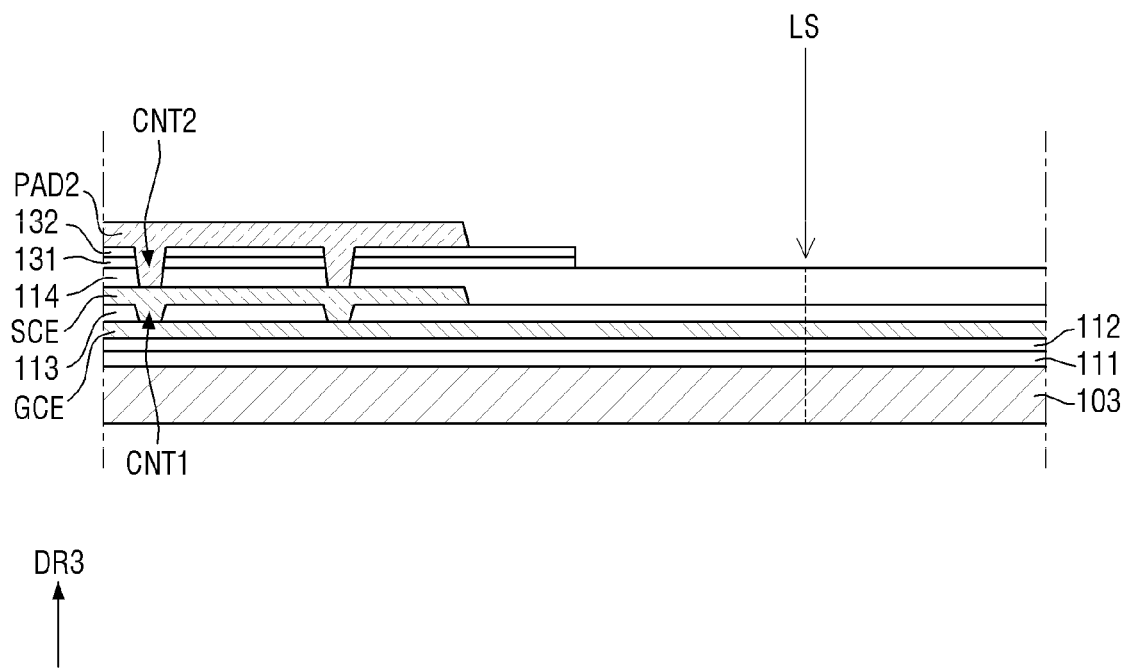
FIG. 11 is a cross-sectional view showing a cutting process of a display panel according to an embodiment.

FIG. 9 a cross-sectional view taken along the line I-I' of FIG. 8, FIG. 10 is a cross-sectional view of the area A in FIG. 9, and FIG. 11 is a cross-sectional view showing a cutting process of a display panel according to an embodiment.

Referring to FIGS. 9 to 11, a panel lower member 400 (including a panel lower sheet 410 and a panel lower bonding layer 430) may be further disposed under the base substrate 103.

The panel lower sheet 410 includes at least one functional layer. The functional layer may perform a heat dissipation function, an electromagnetic wave blocking function, a grounding function, a buffering function, a strength reinforcing function, a supporting function, and/or a digitizing function. The functional layer may be/include a sheet layer, a film layer, a thin film layer, a coating layer, a panel, and/or a plate. The functional layer may be a single layer or may include a plurality of stacked thin films or coating layers. The functional layer may be/include a support substrate, a heat dissipation layer, an electromagnetic wave blocking layer, a shock absorbing layer, and/or a digitizer.

The panel lower bonding layer 430 may be disposed between the panel lower sheet 410 and the base substrate 103. The panel lower bonding layer 430 may include a pressure sensitive adhesive (PSA). The panel lower bonding layer 430 may include a pressure sensitive adhesive containing a conductive material.

Side surfaces of the base substrate 103, the buffer layer 111, the gate insulating layer 112, the interlayer insulating layer 113, and the via layer 114 may be aligned and/or coplanar in the thickness direction DR3.

Referring to FIG. 11, after sequentially stacking the components of the display panel 10 on the base substrate 103 up to the film attachment pad PAD2, the display panel including the buffer layer 111, the gate insulating layer 112, the interlayer insulating layer 113, and the via layer 114 may be cut by a laser LS. After the display panel 10 has been cut by the laser LS, as shown in FIG. 9, the side surfaces of the base substrate 103, the buffer layer 111, the gate insulating layer 112, the interlayer insulating layer 113, and the via layer 114 may be aligned in the thickness direction DR3.

When the display panel 10 is cut by the laser LS, the exposed surfaces of members including an organic material, for example, the base substrate 103 and the via layer 114 may include carbide surfaces that include carbide particles CPL. Carbide particles CPL may be disposed on the side surfaces of adjacent members, for example, the buffer layer 111, the gate insulating layer 112, and the interlayer insulating layer 113.

Each of the gate connection electrode GCE and the source connection electrode SCE may overlap the film attachment pad PAD2 in the thickness direction DR3. The gate connection electrode GCE may extend to the end of the base substrate 103. An end/edge of the source connection electrode SCE may be aligned with an end/edge of the film attachment pad PAD2 in the thickness direction DR3 and may be positioned between a first contact hole CNT1 and each of the side above-mentioned surfaces of the layers 111, 112, and 113.

The source connection electrode SCE may be connected to the gate connection electrode GCE through the first contact hole CNT1 penetrating the interlayer insulating layer 113 in the thickness direction DR3, and the film attachment pad PAD2 may be connected to the source connection electrode SCE through a second contact hole CNT2 penetrating the via layer 114 and the touch insulating layers 131 and 132 in the thickness direction.

The film attachment pad PAD2 may be connected to each of the gate connection electrode GCE and the source connection electrode SCE, and thus resistance may be lowered.

The flexible printed circuit film 30 may include a film support layer 330, a first film conductive layer 320 disposed on a first surface of the film support layer 330, a first solder resist layer 310 disposed on the first film conductive layer 320, a second film conductive layer 340 disposed on a second surface of the film support layer 330 (which is the opposite the first surface of the film support layer 330), and a second solder resist layer 350 disposed on the second film conductive layer 340.

The film support layer 330 may be made of an insulating material such as a polymer resin. Examples of the polymer resin may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and combinations of some of the above materials.

Each of the film conductive layers 320 and 340 may include at least one metal selected from molybdenum (Mo), aluminum (Al), platinum (Pt), lead (Pd), silver (Ag), magnesium (Mg), gold (Au), nickel (Ni), neo It may include one or more metals selected from sodium (Nd), iridium (Jr), chromium (Cr), calcium (Ca), titanium (Ti), tantalum (Ta), tungsten (W), and copper (Cu). Each of the first and second film conductive layers 320 and 340 may be a single-layer film or a multi-layer film. The multi-layer film may include stacked films of different metals.

Each of the solder resist layers 310 and 350 may include an insulating resin. Examples of the insulating resin may include polyethersulphone (PES), polyacrylate (PA), polyarylate (PAR), polyetherimide (PEI), polyethylene napthalate (PEN), polyethylene terepthalate (PET), polyphenylene sulfide (PPS), polyallylate, polyimide (PI), polycarbonate (PC), cellulose triacetate (CAT), cellulose acetate propionate (CAP), and combinations of some of the above materials.

The first film conductive layer 320 may be disposed between the film support layer 330 and the first solder resist layer 310, the film support layer 330 may be disposed between the first film conductive layer 320 and the second film conductive layer 340, and the second film conductive layer 340 may be disposed between the film support layer 330 and the second solder resist layer 350.

The second film conductive layer 340 may include a first film conductive pattern 341 and a second film conductive pattern 342 spaced apart from the first film conductive pattern 341 with an intervening space SP. The first film conductive pattern 341 may overlap the film attachment pad PAD2 in the thickness direction DR3, and the second film conductive pattern 342 may not overlap the film attachment pad PAD2 in the thickness direction DR3. The second film conductive pattern 342 may be disposed beyond the end of the base substrate 103.

Each of the first film conductive pattern 341 and the second film conductive pattern 342 may be connected to the first film conductive layer 320 through a film contact hole CNT3.

The first film conductive pattern 341 and the second film conductive pattern 342 may be electrically connected to the film attachment pad PAD2 through an anisotropic conductive film ACF. As shown in FIG. 10, the anisotropic conductive film ACF may include a resin film RL and a plurality of conductive balls CB dispersed in the resin film RL. The structure of a conductive ball CB may have a polymer particle and a metal such as nickel (Ni) or gold (Au) coated on the surface of the polymer particle. The resin film RL may include a thermosetting resin or a thermoplastic resin. The resin film RL of the anisotropic conductive film ACF may further include an adhesive.

The anisotropic conductive film ACF may extend beyond the side surface of the base substrate 103.

The space SP may overlap the side surface of the base substrate 103 in the thickness direction DR3, such that the side surface of the base substrate 103 may be positioned two edges of the space SP in the first direction DR1. In the space SP, the film support layer 330 may partially cover the inner surface of each of the first and second film conductive patterns 341 and 342. In the space SP, the height of the surface of the film support layer 330 may be smaller than the height of the surface of each of the first and second film conductive patterns 341 and 342.

The second film conductive layer 340 may further include a third film conductive pattern 343 disposed in the space SP. The third film conductive pattern 343 may be spaced apart from each of the first film conductive pattern 341 and the second film conductive pattern 342. The third film conductive pattern 343 may overlap the side surface of the base substrate 103 in the thickness direction DR3 such that the side surface of the base substrate 103 is positioned between two opposite edges of the third film conductive pattern 343 in the first direction DR1.

The third film conductive pattern 343 may be a floating electrode. The third film conductive pattern 343 may be separated from the adjacent film conductive patterns 341 and 342 without being electrically connected to the first film conductive layer 320.

The second solder resist layer 350 may cover the second film conductive pattern 342 and may expose the space SP and the first film conductive pattern 341. Side surfaces of the second solder resist layer 350 may be located outside/beyond the side surface of the base substrate 103 in the first direction DR1.

When the floating space of the anisotropic conductive film ACF is not sufficient, one or more portions of the anisotropic conductive film ACF may agglomerate, and thus the adhesion between the flexible printed circuit film 30 and the display panel 10 may be difficult. When the side surface of the second solder resist layer 350 is located outside the side surface of the base substrate 103, a sufficient floating space of the anisotropic conductive film ACF may be secured.

The display device 1 may further include a cover layer CRD covering the second solder resist layer 350 and the anisotropic conductive film ACF from the outside. The cover layer CRD may prevent conductive particles, for example, $F^-$ particles and $S^{2-}$ particles from the panel lower bonding layer 430 from contacting the second film conductive layer 340 of the flexible printed circuit film 30. Furthermore, the cover layer CRD may prevent moisture from being introduced into the flexible printed circuit film 30.

As described above, when the display panel 10 is cut by the laser LS, members including an organic material, for example, the base substrate 103 and the via layer 114 may cause the exposed surface of the display panel 10 to include a carbide surface. The carbide surface may have higher conductivity than the original layers.

If the space SP and the third film conductive pattern 343 are not implemented, since the anisotropic conductive film ACF protrudes from the side surface of the base substrate 103, a short may occur between the carbide surface (with increased conductivity) and the overlying flexible printed circuit film 30 and/or between the carbide particles CPL and the flexible printed circuit film 30.

If the space SP and the third film conductive pattern 343 are not implemented, since the carbide surface and/or carbide particles CPL of the base substrate 103 and the via layer 114 may extend/diffuse along the side surface of the base substrate 103, a short between the film attachment pads PAD2 may occur, and a driving failure may occur.

According to an embodiment, in the second film conductive layer 340, the first film conductive pattern 341 may be spaced apart from the second film conductive pattern 342 with the space SP coinciding with the side surface of the display panel 10 that includes the carbide surface and/or carbide particles CPL, and the third film conductive pattern 343 disposed in the space SP may be a floating electrode, thereby preventing a short between the film attachment pads PAD2 and a related driving failure.

In the following description, components identical to or analogous to those already described may be referred to by the same reference numeral, and associated description may not be repeated.

Figure 12:
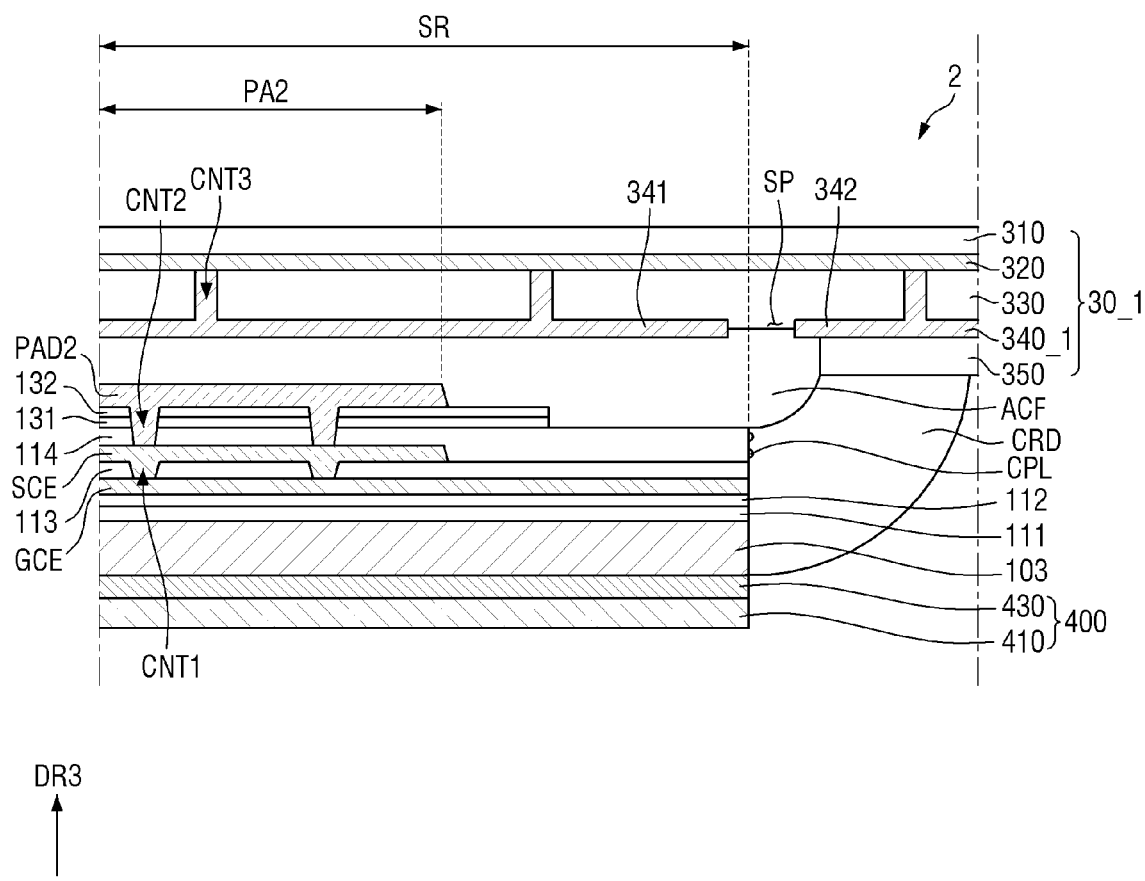
FIG. 12 is a cross-sectional view of a display device according to an embodiment.

FIG. 12 is a cross-sectional view of a display device 2 according to an embodiment.

Referring to FIG. 12, the display device 2 is different from the display device 1 of FIG. 9 in that no third film conductive pattern 343 is provided in the space SP of a flexible printed circuit film 30_1.

In the display device 2 without a third film conductive pattern 343, an extra floating space of the anisotropic conductive film ACF may be provided.

In the display device 2, the first film conductive pattern 341 may be spaced apart from the second film conductive pattern 342 with the space SP coinciding with the side surface of the display panel that includes the carbide surface and/or carbide particles CPL, thereby preventing a short between the film attachment pads PAD2 and a related driving failure.

Figure 13:
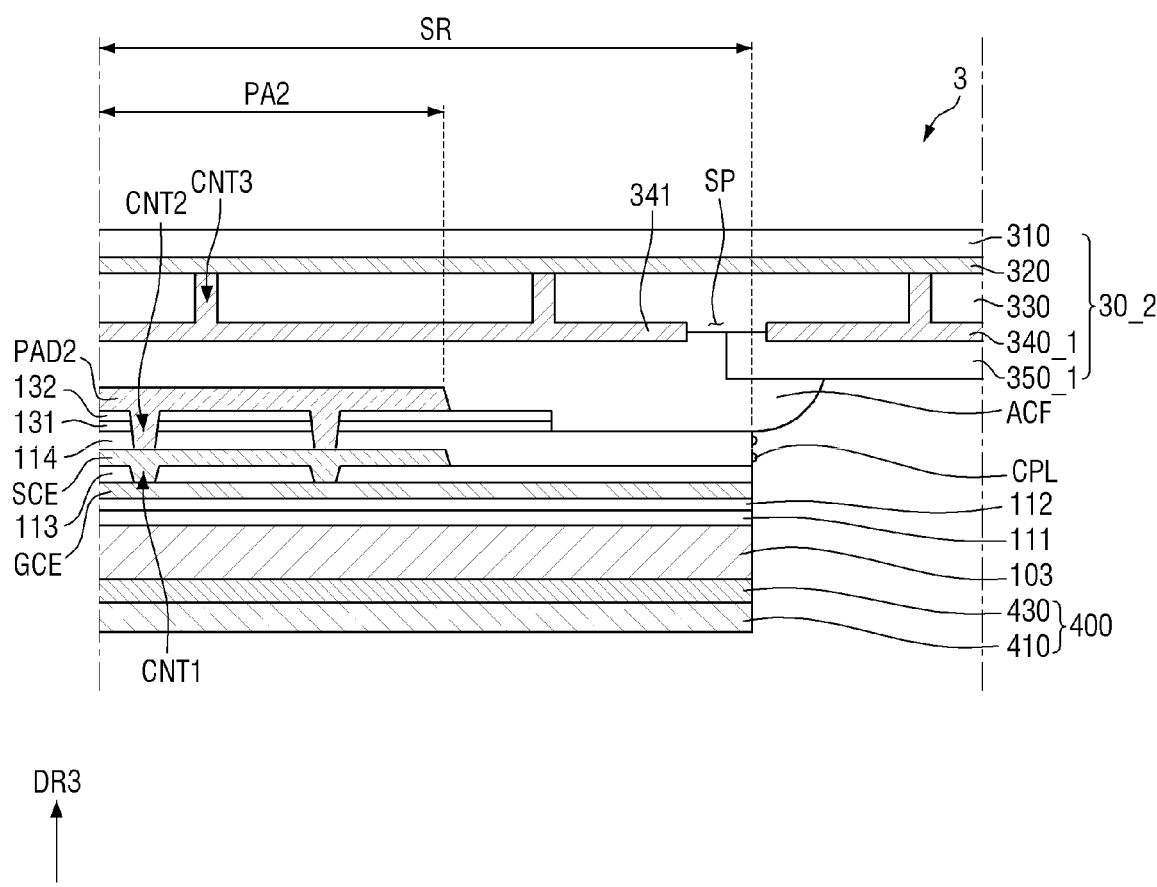
FIG. 13 is a cross-sectional view of a display device according to an embodiment.

FIG. 13 is a cross-sectional view of a display device 3 according to an embodiment.

Referring to FIG. 13, the display device 3 is different from the display device 2 of FIG. 12 in that a second solder resist layer 350_1 of a flexible printed circuit film 30_2 covers/overlaps the side surface of the base substrate 103 in the thickness direction DR3.

The second solder resist layer 350_1 may overlap a part of the space SP and the side surface of the base substrate 103 in the thickness direction DR3.

In the display device 3, the second solder resist layer 350_1 may prevent conductive particles of the panel lower bonding layer 430 from penetrating into the flexible printed circuit film 30_2.

In the display device 3, the cover layer CRD of FIG. 12 may be optional. Thus, cost reduction may be realized.

Figure 14:
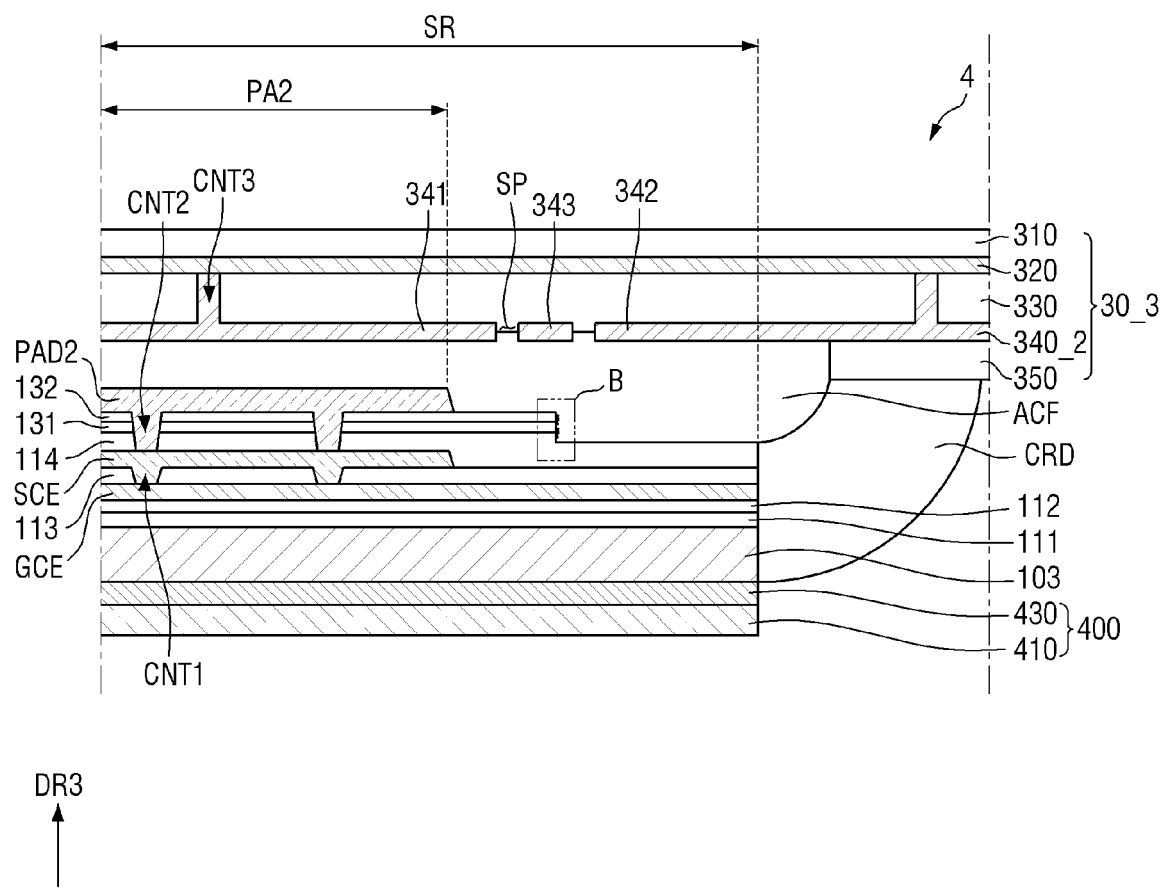
FIG. 14 is a cross-sectional view of a display device according to an embodiment.
Figure 15:
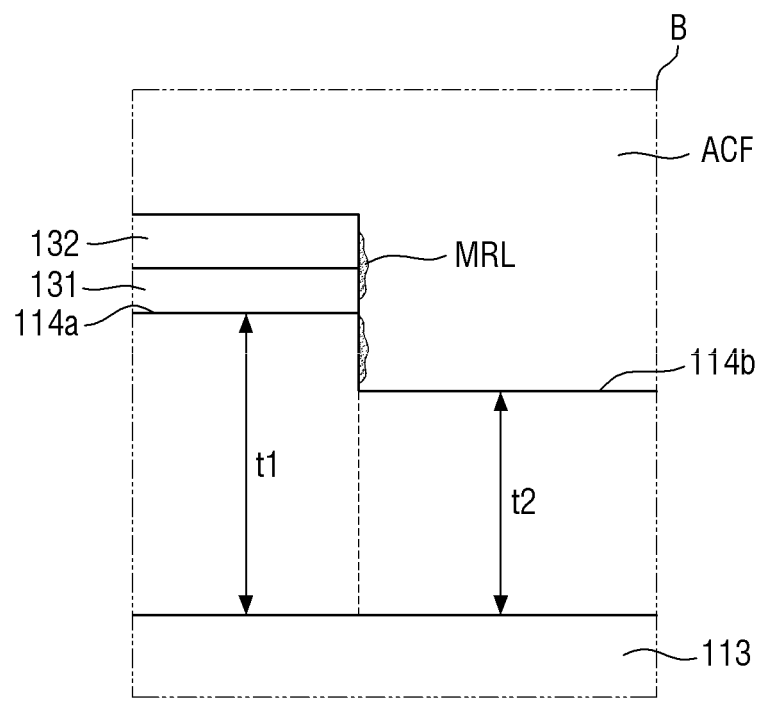
FIG. 15 is a cross-sectional view of the area B in FIG. 14 according to an embodiment.

FIG. 14 is a cross-sectional view of a display device 4 according to an embodiment, FIG. 15 is a cross-sectional view of the area B in FIG. 14, and FIGS. 16 to 20 are cross-sectional views illustrating structures related to process steps of a method for manufacturing the display device 4 according to an embodiment.

Referring to FIGS. 14 and 15, the display device 4 is different from the display device 1 of FIG. 9 in that the space SP of a second film conductive layer 340_2 of a flexible printed circuit film 30_3 overlaps the side surfaces of the touch insulation layers 131 and 132 in the thickness direction DR3, such that the side surfaces of the touch insulation layers 131 and 132 are positioned between two opposite edges of the space SP.

In the display device 4, the via layer 114_1 may be divided into portions having different thicknesses by a boundary at the side surfaces of the touch insulating layers 131 and 132. For example, the via layer 114_1 may include a first via portion 114a overlapping the touch insulating layers 131 and 132 in the thickness direction DR3, and a second via portion 114b connected to the first via portion 114a and not overlapping the touch insulating layers 131 and 132 in the thickness direction DR3.

The first thickness t1 of the first via portion 114a may be greater than the second thickness t2 of the second via portion 114b in the thickness direction DR3.

A part of the side surface of the first via portion 114a, adjacent to the second via portion 114b, may be covered by the second via portion 114b, and another part of the side surface of the first via portion 114a may be exposed by the second via portion 114b.

The side surface of the first via portion 114a may be aligned (and coplanar) with the side surfaces of the overlying touch insulating layers 131 and 132 in the thickness direction DR3. Metal residues MRL may be disposed directly on the part of the side surface of the first via portion 114a exposed by the second via portion 114b and may be disposed directly on the side surfaces of the touch insulating layers 131 and 132.

A process of forming the via layer 114_1 is described with reference to FIGS. 16 to 20.

Figure 16:
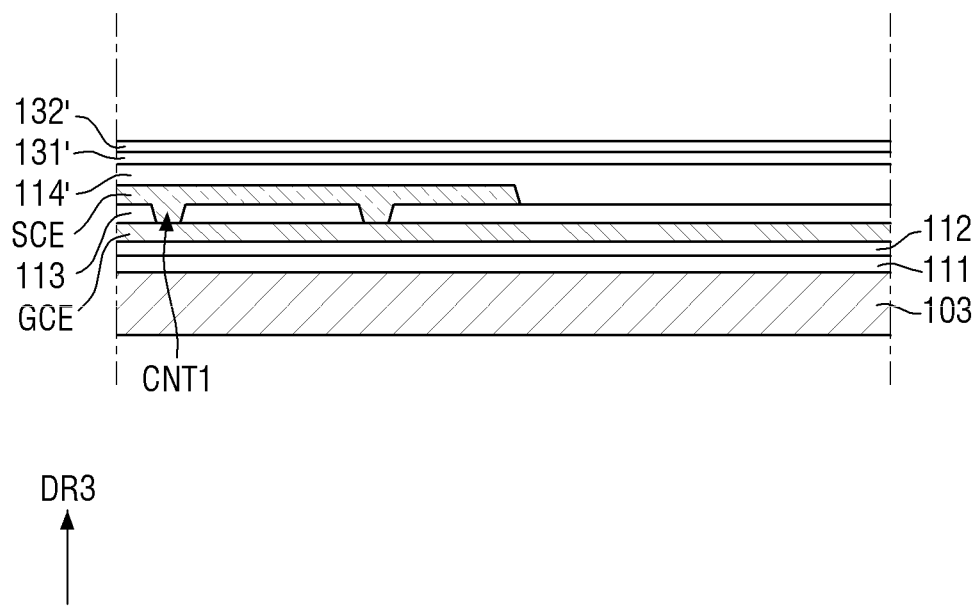
FIG. 16, FIG. 17, FIG. 18, FIG. 19, and FIG. 20 are cross-sectional views illustrating structures related to process steps of a method for manufacturing the display device of FIG. 14 according to an embodiment.

Referring to FIG. 16, a via layer material 114' is deposited on the interlayer insulating layer 113 and the source connection electrode SCE, and a first touch insulating layer material 131' and a second touch insulating layer material 132' are sequentially deposited on the via layer material 114'.

The via layer material 114' may include acrylate and/or polyimide. Each of the first touch insulating layer material 131' and the second touch insulating layer material 132' may include (or may be made of) an inorganic material. The inorganic material may include at least one of silicon oxide (SiOx), silicon nitride (SiNx), and silicon oxynitride (SiONx).

Figure 17:
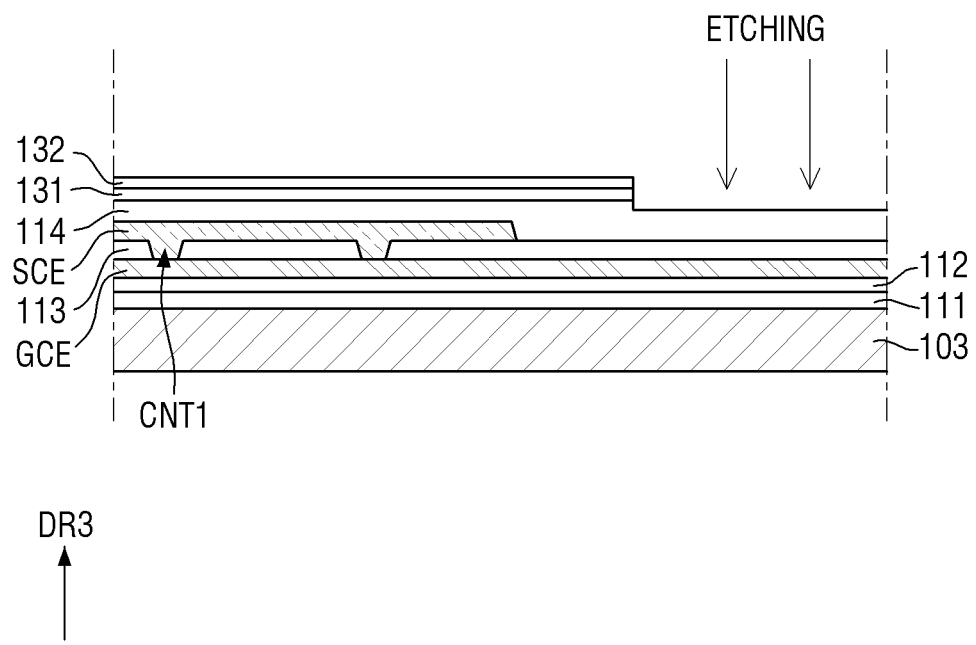

Subsequently, referring to FIG. 17, the touch insulating layer materials 131' and 132' are etched. The touch insulating layer materials 131' and 132' may be etched by dry etching. Consequently, the side surfaces of the touch insulating layers 131 and 132 may be located between an outer surface/face/edge of the source connection electrode SCE and the side surface/face/edge of the base substrate 103 (in the first direction DR1).

When etching the touch insulating layer materials 131' and 132', the surface of the via layer material 114' may also be partially removed. Thus, via portions 114a and 114b having different thicknesses may be formed.

Figure 18:
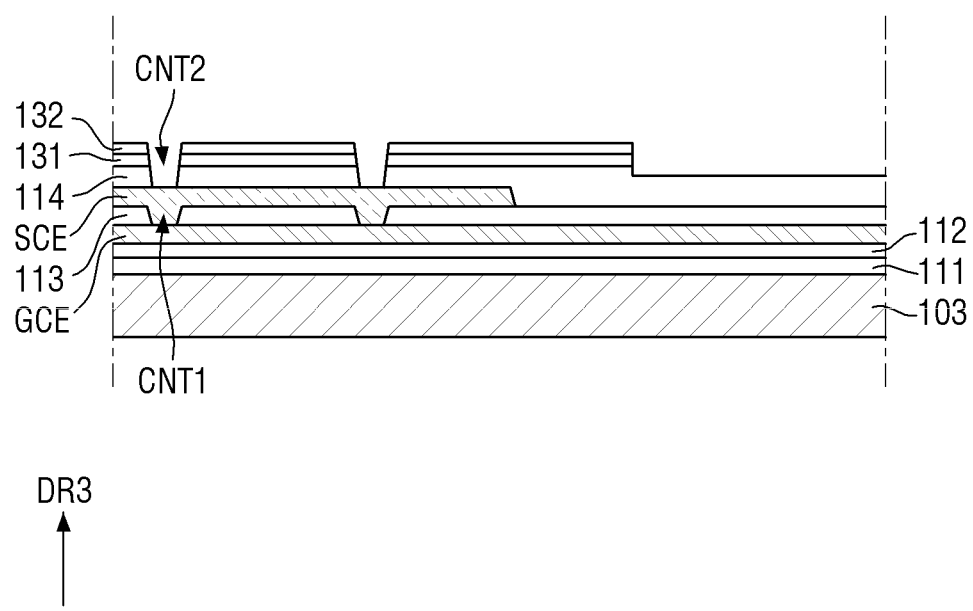

Subsequently, referring to FIG. 18, a second contact hole CNT2 is formed.

Figure 19:
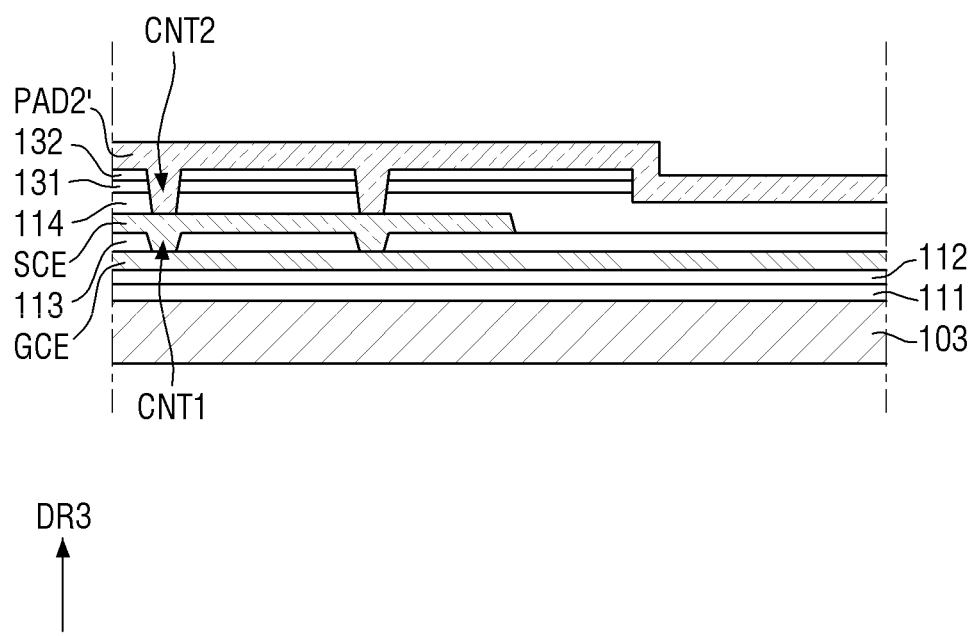

Subsequently, referring to FIG. 19, a film attachment pad material PAD2' is deposited on the touch insulating layers 131 and 132 and the via portions 114a and 114b. The film attachment pad material PAD2' may also be formed on the side surface of the first via portion 114a between the above-described side surface/edge of the source connection electrode SCE and the side surface/edge of the base substrate 103.

The film attachment pad material PAD2' may fill the second contact hole CNT2 and may be directly connected to the source connection electrode SCE.

Figure 20:
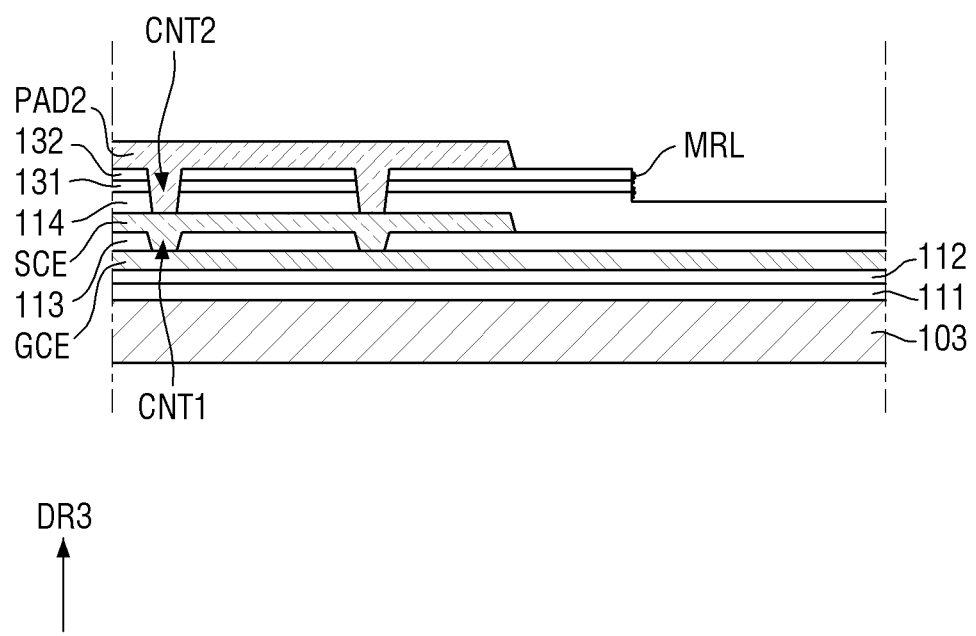

Subsequently, referring to FIG. 20, in the film attachment pad material PAD2', a portion from the outer side surface of the source connection electrode SCE to the side surface of the base substrate 103, except for a portion overlapping the source connection electrode SCE in the thickness direction DR3 (film attachment pad PAD2), is removed. In the process, wet etching may be used.

Metal residues MRL may remain on the side surfaces of the touch insulating layers 131 and 132 and the side surface of the first via portion 114a exposed by the second via portion 114b. The metal residues MRL may include the same material as the film attachment pad PAD2.

Referring to FIG. 14, an anisotropic conductive film ACF may be disposed on the side surfaces of the touch insulating layers 131 and 132 and the side surface of the first via portion 114a exposed by the second via portion 114b. The anisotropic conductive film ACF may directly contact the side surfaces of the touch insulating layers 131 and 132 and the side surface of the first via portion 114a exposed by the second via portion 114b. The anisotropic conductive film ACF may also directly contact the metal residue MRL.

If the space SP and the floating electrode third film conductive pattern 343 are not implemented, since the metal residues MRL may extend/diffuse along the side surface of the first via portion 114a, a short between the film attachment pads PAD2 may occur, such that a driving failure may occur.

In the display device 4, the space SP of the second film conductive layer 340_2 of the flexible printed circuit film 30_3 may overlap the side surfaces of the touch insulating layers 131 and 132 in the thickness direction. The space SP may also overlap the metal residues MRL in the thickness direction. Thus, a short between the film attachment pads PAD2 and a related driving failure may be prevented.

Figure 21:
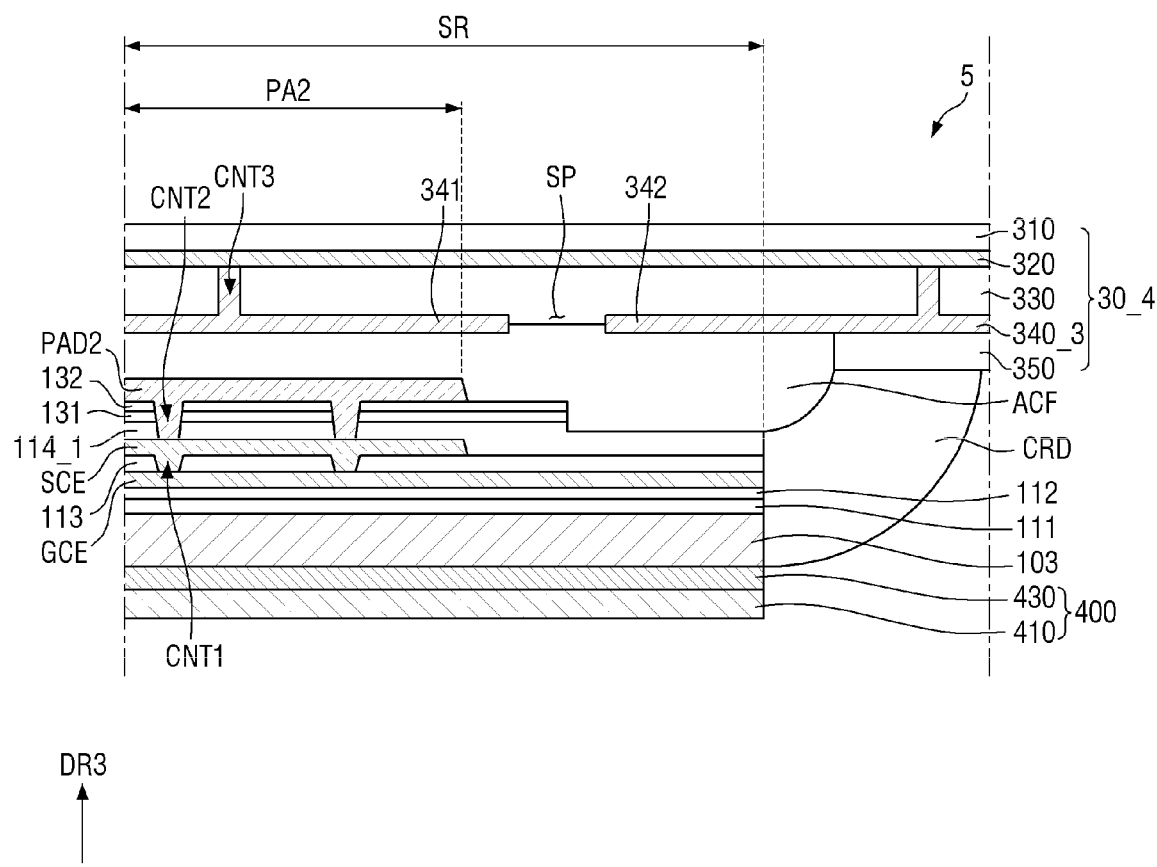
FIG. 21 is a cross-sectional view of a display device according to an embodiment.

FIG. 21 is a cross-sectional view of a display device 5 according to an embodiment.

Referring to FIG. 21, the display device 5 is different from the display device 4 of FIG. 14 in that no third film conductive pattern 343 is provided in the space SP of a flexible printed circuit film 30_4.

In the display device 5, a sufficient floating space of the anisotropic conductive film ACF may be provided.

In the display device 5, the space SP of the second film conductive layer 340_3 of the flexible printed circuit film 30_4 may overlap the side surfaces of the touch insulating layers 131 and 132 in the thickness direction DR3. The space SP may also overlap the metal residues MRL in the thickness direction DR3. Thus, a short between the film attachment pads PAD2 and a related driving failure may be prevented.

Figure 22:
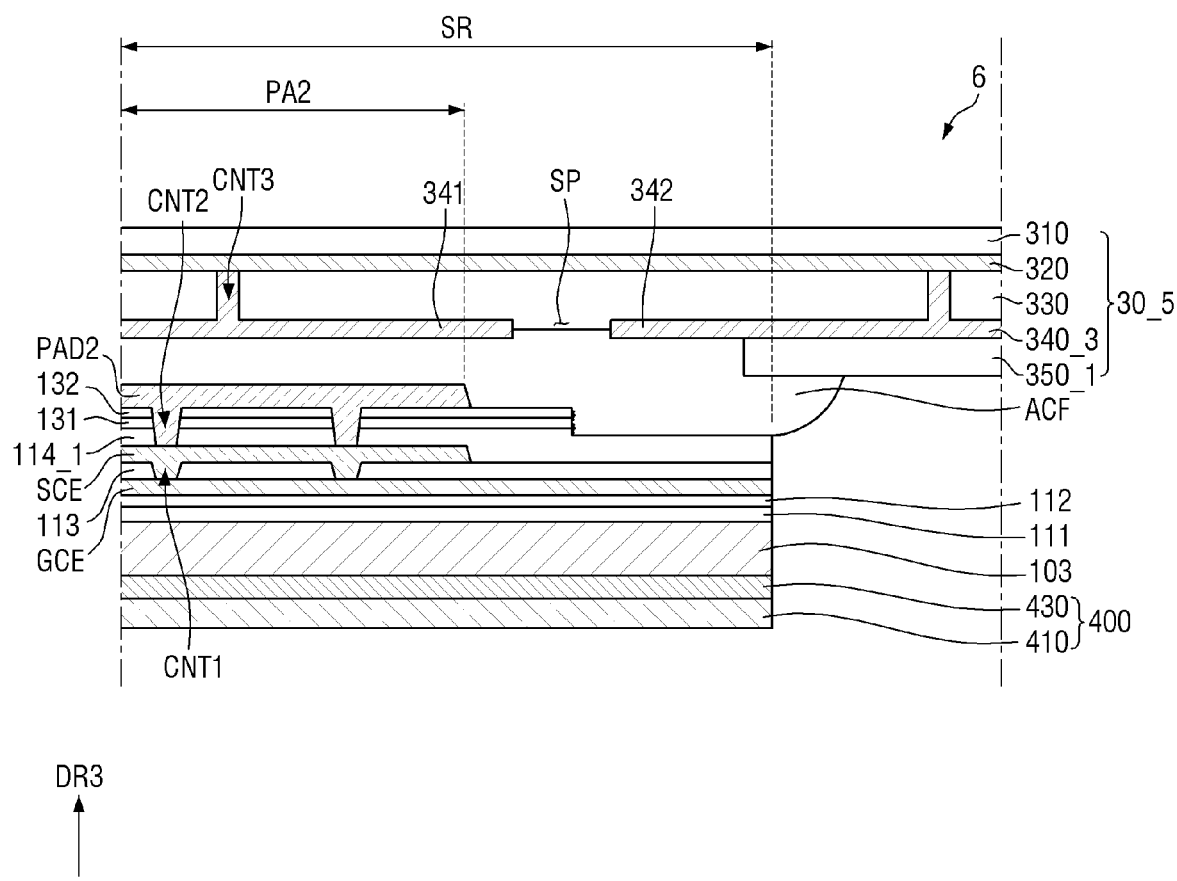
FIG. 22 is a cross-sectional view of a display device according to an embodiment.

FIG. 22 is a cross-sectional view of a display device 6 according to an embodiment.

Referring to FIG. 22, the display device 6 is different from the display device 5 of FIG. 21 in that the second solder resist layer 350_1 of a flexible printed circuit film 30_5 covers the side surface of the base substrate 103 in the thickness direction DR3.

According to the display device 6, the cover layer CRD of FIG. 21 may be omitted. Thus, cost reduction may be realized.

Figure 23:
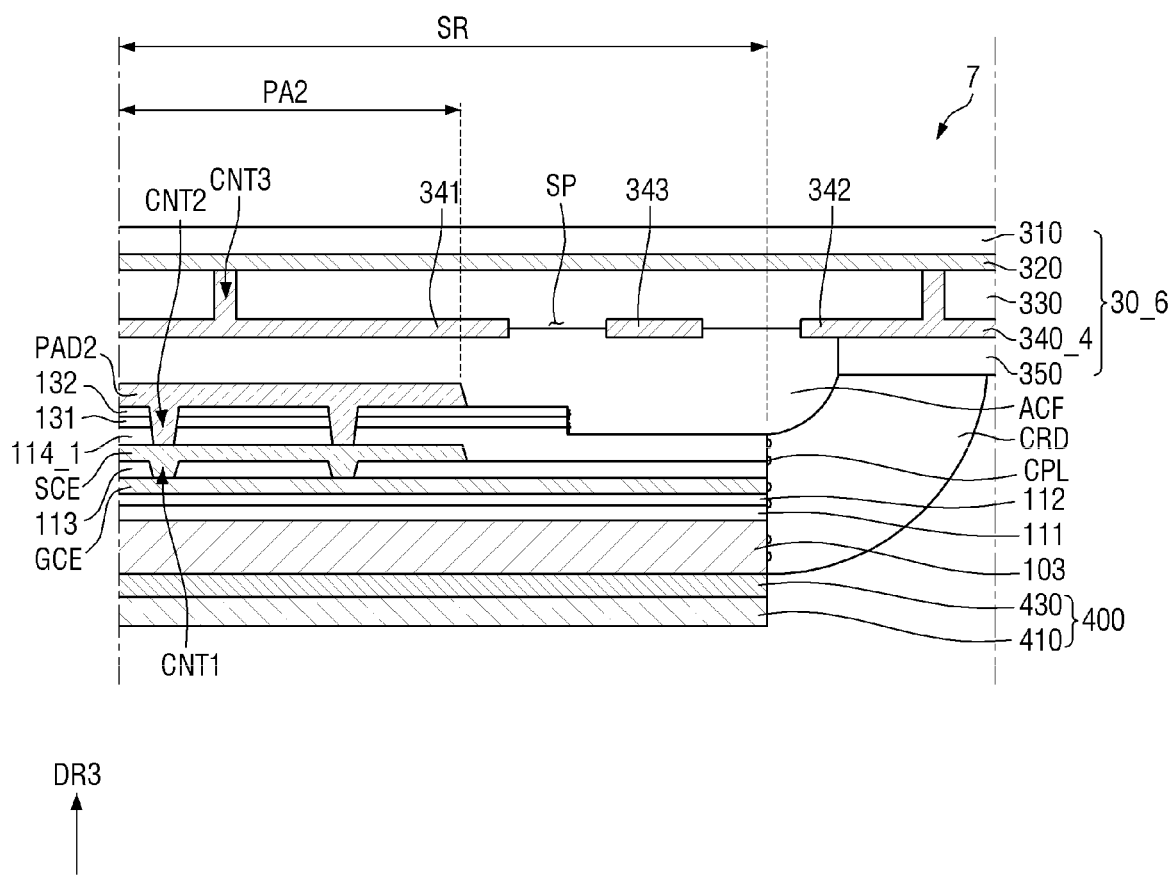
FIG. 23 is a cross-sectional view of a display device according to an embodiment.

FIG. 23 is a cross-sectional view of a display device 7 according to an embodiment.

Referring to FIG. 23, the display device 7 is different from the display device 1 of FIG. 9 in that the space SP of a second touch conductive layer 340_4 of a flexible printed circuit film 30_6 overlaps the side surfaces of the touch insulating layers 131 and 132 and overlaps the side surface of the base substrate 103 in the thickness direction DR3.

The third film conductive pattern 343 of the second film conductive layer 340_4 may be disposed in the space SP. The third film conductive pattern 343 may be spaced apart from each of the first film conductive pattern 341 and the second film conductive pattern 342.

The third film conductive pattern 343 may be a floating electrode. The third film conductive pattern 343 may be separated from the adjacent film conductive patterns 341 and 342 without being electrically connected to the first film conductive layer 320.

Figure 24:
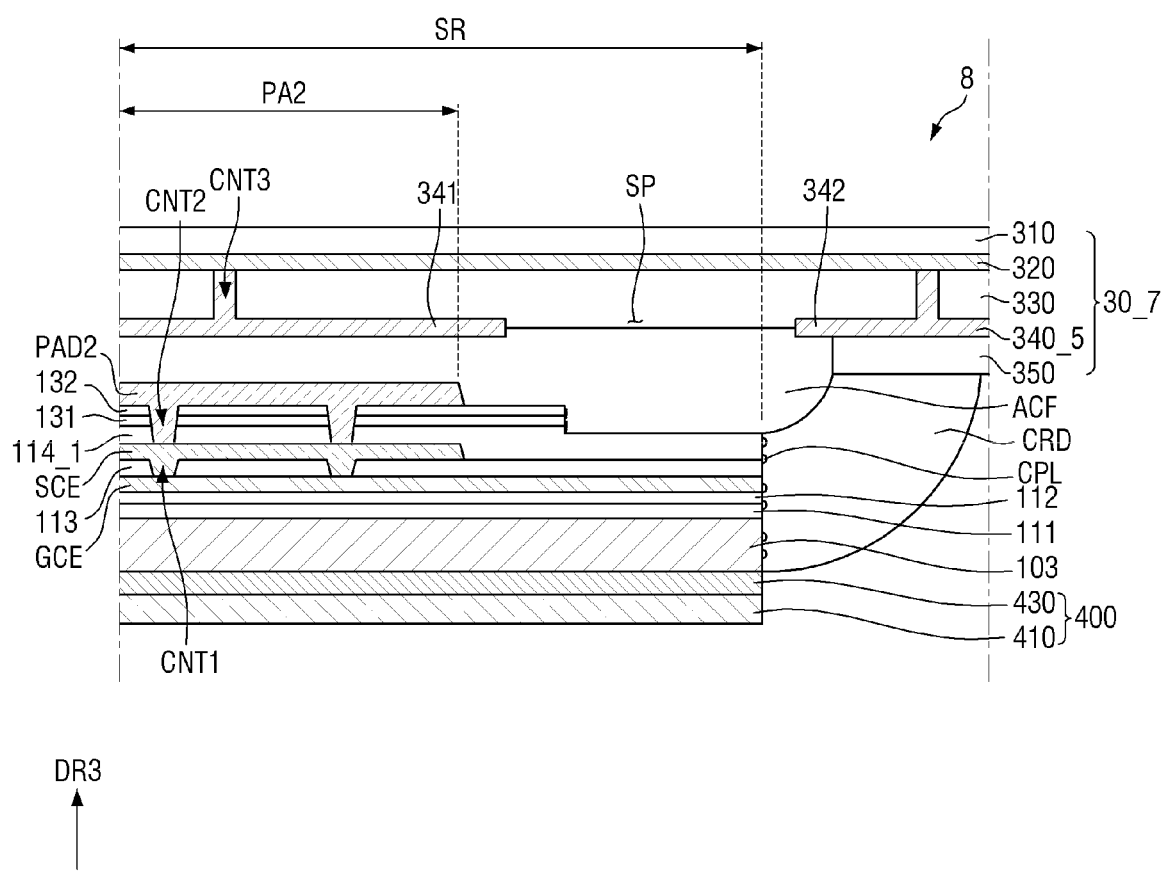
FIG. 24 is a cross-sectional view of a display device according to an embodiment.

FIG. 24 is a cross-sectional view of a display device 8 according to another embodiment.

Referring to FIG. 24, the display device 8 is different from the display device 7 of FIG. 23 in that no third film conductive pattern 343 is provided in the space SP of a flexible printed circuit film 30_7.

Figure 25:
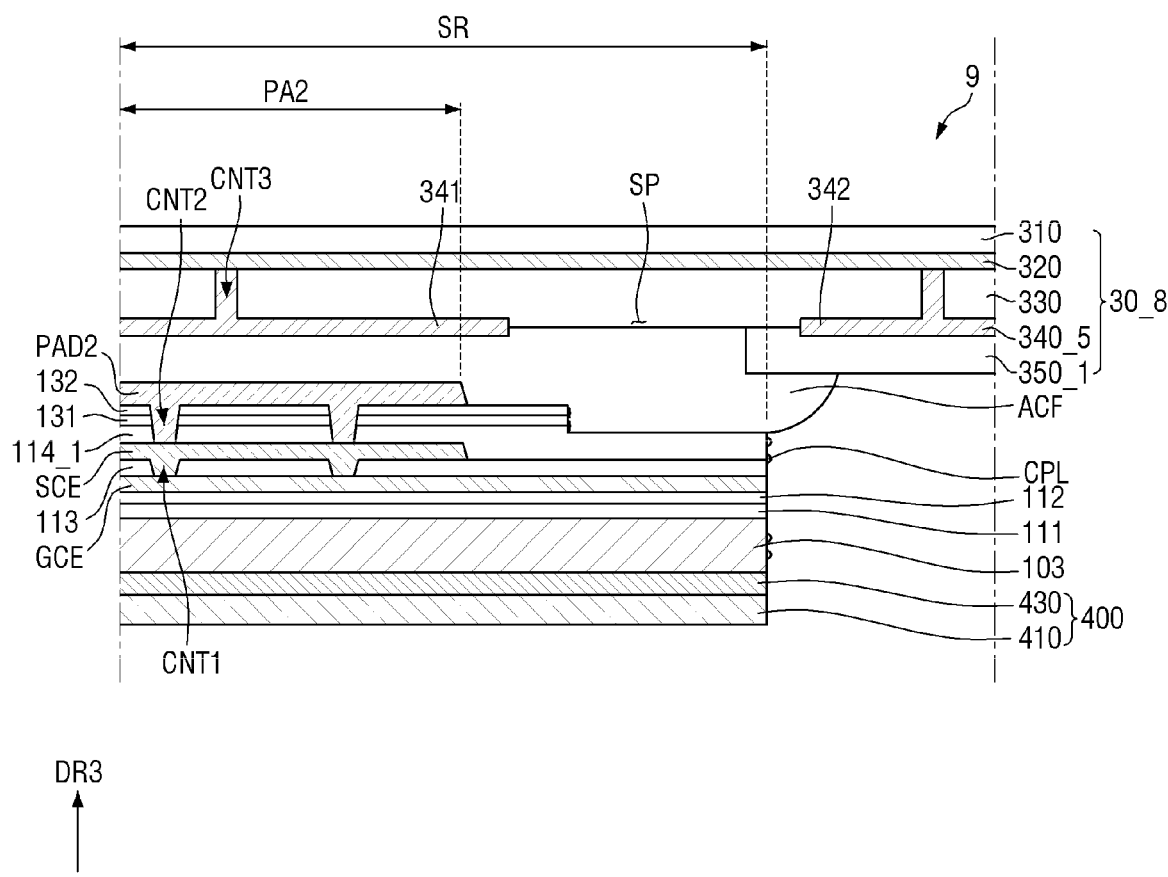
FIG. 25 is a cross-sectional view of a display device according to an embodiment.

FIG. 25 is a cross-sectional view of a display device 9 according to another embodiment.

Referring to FIG. 25, the display device 9 is different from the display device 8 of FIG. 24 in that the second solder resist layer 350_1 of a flexible printed circuit film 30_8 covers the side surface of the base substrate 103.

Figure 26:
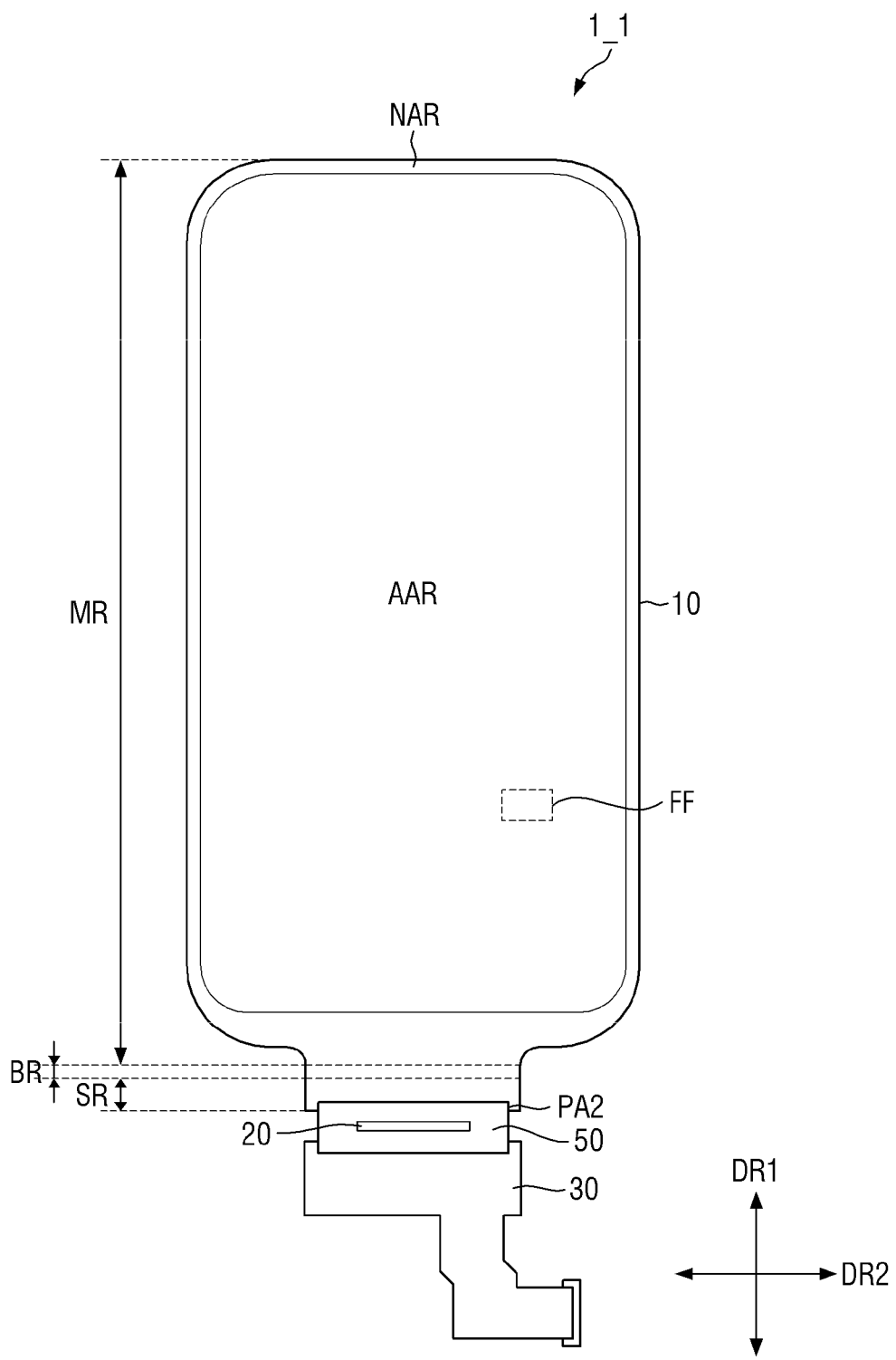
FIG. 26 is a cross-sectional view of a display device according to an embodiment.

FIG. 26 is a plan view of a display device 1_1 according to an embodiment.

Referring to FIG. 26, the display device 1_1 is different from the display device 1 of FIGS. 1 to 9 in that the display device 1_1 includes a chip on film 50 attached to the second pad area PA2 of the display panel 10.

The driving chip 20 of FIG. 1 may be mounted on the chip on film 50. One end of the chip on film 50 may be attached to the second pad area PA2 of the display panel 10, and the other end of the chip on film 50 may be attached to the flexible printed circuit film 30.

The coupling relationship between the display panel 10 and the flexible printed circuit film 30 described above with reference to FIGS. 1 to 9 may be substantially applied to the coupling relationship between the display panel 10 and the chip-on film 50 illustrated in FIG. 26.

Embodiments may prevent driving failure potentially caused by a short between film attachment pads.

Although example embodiments have been disclosed for illustrative purposes, various modifications, additions, and substitutions are possible without departing from the scope defined in the accompanying claims.

What is claimed is:

1. A display device, comprising:
a base substrate comprising an active area and a non-active area neighboring the active area;
a plurality of film attachment pads disposed on the non-active area;
a flexible printed circuit film disposed on the plurality of film attachment pads; and
an anisotropic conductive film disposed between the plurality of film attachment pads and the flexible printed circuit film,
wherein the flexible printed circuit film includes:
a film support layer;
a first film conductive layer disposed on a first surface of the film support layer; and
a second film conductive layer disposed on a second surface of the film support layer opposite the first surface of the film support layer,
wherein the second film conductive layer includes:
a first film conductive member;
a second film conductive member; and
a space positioned between the first film conductive member and the second film conductive member,
wherein the first film conductive member and the second film conductive member are electrically connected to the first film conductive layer through a first contact hole and a second contact hole, respectively,
wherein a side surface of the base substrate is positioned between two edges of the space in a direction parallel to the first surface of the film support layer, and
wherein the anisotropic conductive film extends beyond the side surface of the base substrate in the direction.

2. The display device of claim 1,
wherein the flexible printed circuit film further includes:
a first solder resist layer disposed on the first film conductive layer; and
a second solder resist layer disposed on the second film conductive layer.

3. The display device of claim 2,
wherein the first film conductive layer is disposed between the film support layer and the first solder resist layer,
wherein the film support layer is disposed between the first film conductive layer and the second film conductive layer, and
wherein the second film conductive layer is disposed between the film support layer and the second solder resist layer.

4. The display device of claim 3,
wherein the second film conductive layer further includes a third film conductive member disposed in the space, and
wherein the third film conductive member is spaced apart from each of the first film conductive member and the second film conductive member.

5. The display device of claim 4,
wherein the side surface of the base substrate is positioned between two edges of the third film conductive member in the direction parallel to the first surface of the film support layer.

6. The display device of claim 5,
wherein the third film conductive member is a floating electrode.

7. The display device of claim 6, further comprising:
carbide particles disposed on the side surface of the base substrate.

8. The display device of claim 6,
wherein the side surface of the base substrate includes a carbide surface.

9. The display device of claim 3,
wherein the second solder resist layer at least partially covers the second film conductive member, exposes each of the space and the first film conductive member, and is spaced from the side surface of the base substrate in the direction parallel to the first surface of the film support layer.

10. The display device of claim 9, further comprising:
an insulating cover layer directly contacting each of the second solder resist layer and the anisotropic conductive film.

11. The display device of claim 3, further comprising:
a panel sheet overlapping the base substrate; and
a panel bonding layer disposed between the panel sheet and the base substrate,
wherein the side surface of the base substrate is positioned between two edges of the second solder resist layer in the direction parallel to the first surface of the film support layer, and
wherein the panel bonding layer includes a conductive material.

12. The display device of claim 3, further comprising:
a driving chip mounted on the flexible printed circuit film.

13. The display device of claim 3, further comprising:
a driving chip, wherein a portion of the non-active area is disposed between the driving chip and the active area.

14. A display device, comprising:
a base substrate comprising an active area and a non-active area neighboring the active area;
an interlayer insulating layer disposed on the base substrate;
a via layer disposed on the interlayer insulating layer;
a touch insulating layer disposed on the via layer;
a film attachment pad disposed on the non-active area;
a flexible printed circuit film disposed on the film attachment pad; and
an anisotropic conductive film disposed between the film attachment pad and the flexible printed circuit film,
wherein the flexible printed circuit film includes:
a film support layer;
a first film conductive layer disposed a first surface of the film support layer; and
a second film conductive layer disposed a second surface of the film support layer opposite the first surface of the film support layer,
wherein the second film conductive layer includes:
a first film conductive member;
a second film conductive member; and
a space positioned between the first film conductive member and the second film conductive member,
wherein the first film conductive member and the second film conductive member are electrically connected to the first film conductive layer through a first contact hole and a second contact hole, respectively,
wherein the film attachment pad is disposed on the touch insulating layer,
wherein a side surface of the touch insulating layer is disposed between a side surface of the film attachment pad and a side surface of the base substrate in a direction parallel to the first surface of the film support layer,
wherein the via layer includes a first via layer portion overlapping the touch insulating layer in a thickness direction of the via layer and includes a second via layer portion connected to the first via layer portion and not overlapping the touch insulating layer in the thickness direction of the via layer,
wherein a maximum thickness of the second via layer portion in the thickness direction of the via layer is less than a maximum thickness of the first via layer portion in the thickness direction of the via layer, and
wherein a side surface of the first via layer portion is positioned between two edges of the space in the direction parallel to the first surface of the film support layer.

15. The display device of claim 14, further comprising:
a metal residue disposed on the side surface of the first via layer portion,
wherein a material of the metal residue is identical to a material of the film attachment pad.

16. The display device of claim 15, further comprising:
a source connection electrode overlapping the film attachment pad in the thickness direction of the via layer,
wherein the source connection electrode is disposed between the base substrate and the touch insulating layer and is electrically connected to the film attachment pad through a through hole penetrating the via layer and the touch insulating layer.

17. The display device of claim 16, further comprising:
a gate connection electrode overlapping the source connection electrode in the thickness direction of the via layer,
wherein the gate connection electrode is disposed between the base substrate and the touch insulating layer and is electrically connected to the source connection electrode through a contact hole penetrating the interlayer insulating layer.

18. The display device of claim 15,
wherein the second film conductive layer further includes a third film conductive member disposed in the space,
wherein the third film conductive member is spaced apart from each of the first film conductive member and the second film conductive member,
wherein the third film conductive member overlaps the side surface of the base substrate or the side surface of the first via layer portion in the thickness direction of the via layer, and
wherein the third film conductive member is a floating electrode.

19. The display device of claim 15,
wherein the flexible printed circuit film further includes a first solder resist layer disposed on the first film conductive layer and a second solder resist layer disposed on the second film conductive layer,
wherein the second solider resist layer at least partially covers the second film conductive member, exposes each of the space and the first film conductive member, and is spaced from the side surface of the base substrate in the direction parallel to the first surface of the film support layer, and
wherein the display device further includes an insulating cover layer directly contacting each of the second solder resist layer and the anisotropic conductive film.

20. The display device of claim 15, further comprising:
a panel sheet overlapping the base substrate; and
a panel bonding layer disposed between the panel sheet and the base substrate, wherein the flexible printed circuit film further includes a first solder resist layer disposed on the first film conductive layer and a second solder resist layer disposed on the second film conductive layer,
wherein the second solider resist layer overlaps the side surface of the base substrate in the thickness direction of the via layer, and wherein the panel bonding layer includes a conductive material.

* * * * *